(12) United States Patent
Hatano

(10) Patent No.: US 12,074,182 B2
(45) Date of Patent: Aug. 27, 2024

(54) SEMICONDUCTOR DEVICE, ELECTRONIC APPARATUS, AND METHOD FOR MANUFACTURING SEMICONDUCTOR DEVICE

(71) Applicant: SONY SEMICONDUCTOR SOLUTIONS CORPORATION, Kanagawa (JP)

(72) Inventor: Masaki Hatano, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 737 days.

(21) Appl. No.: 17/267,632

(22) PCT Filed: Jun. 24, 2019

(86) PCT No.: PCT/JP2019/025003
§ 371 (c)(1),
(2) Date: Feb. 10, 2021

(87) PCT Pub. No.: WO2020/039733
PCT Pub. Date: Feb. 27, 2020

(65) Prior Publication Data
US 2021/0313367 A1 Oct. 7, 2021

(30) Foreign Application Priority Data
Aug. 21, 2018 (JP) ................. 2018-154708

(51) Int. Cl.
*H01L 27/146* (2006.01)
*H01L 31/024* (2014.01)

(52) U.S. Cl.
CPC .. *H01L 27/14618* (2013.01); *H01L 27/14683* (2013.01); *H01L 31/024* (2013.01); *H01L 27/14627* (2013.01); *H01L 27/14634* (2013.01)

(58) Field of Classification Search
CPC ......... H01L 27/14618; H01L 27/14683; H01L 31/024; H01L 27/14621; H01L 27/14625;
(Continued)

(56) References Cited

U.S. PATENT DOCUMENTS

| 2004/0041221 A1 | 3/2004 | Boon |
| 2007/0194439 A1* | 8/2007 | Kawabata ......... H01L 27/14618 257/704 |

(Continued)

FOREIGN PATENT DOCUMENTS

| CN | 102867836 A | 1/2013 |
| CN | 107086225 A | 8/2017 |

(Continued)

OTHER PUBLICATIONS

International Search Report and Written Opinion of PCT Application No. PCT/JP2019/025003, issued on Sep. 17, 2019, 08 pages of ISRWO.

*Primary Examiner* — Patricia D Valenzuela
(74) *Attorney, Agent, or Firm* — CHIP LAW GROUP

(57) ABSTRACT

In a semiconductor device, to enable control of the occurrence of warpage of a sensor chip serving as a semiconductor element and a change in the warpage as well as prevention of limitation on an arrangement area of an external terminal and a peripheral component. There is included a semiconductor element in which one plate surface side of a semiconductor substrate is set as a light-receiving side, a substrate part having a recess, the recess being open to face a front surface side that is the light-receiving side and positioning the semiconductor element on the front surface side, and a plate shaped member positioned in the recess in a state where the plate shaped member is fixed to the substrate part, the plate shaped member fixing the semiconductor element to one plate surface side and being provided (Continued)

via a gap on at least another plate surface side with respect to a surface forming the recess.

9 Claims, 12 Drawing Sheets

(58) Field of Classification Search
CPC ... H01L 2224/48465; H01L 2224/8592; H01L 23/02; H01L 23/36; H01L 27/14627; H01L 27/14634; H04N 25/70
See application file for complete search history.

(56) References Cited

U.S. PATENT DOCUMENTS

| | | | |
|---|---|---|---|
| 2013/0010145 A1* | 1/2013 | Hagiwara | H01L 27/14634 348/222.1 |
| 2014/0218573 A1 | 8/2014 | Hagiwara et al. | |
| 2015/0123234 A1 | 5/2015 | Hagiwara et al. | |
| 2019/0035836 A1 | 1/2019 | Watanabe et al. | |

FOREIGN PATENT DOCUMENTS

| | | |
|---|---|---|
| JP | H05183135 A | 7/1993 |
| JP | 2000244785 A | 9/2000 |
| JP | 2002-076313 A | 3/2002 |
| JP | 2003-303946 A | 10/2003 |
| JP | 2005072258 A | 3/2005 |
| JP | 2005101711 A | 4/2005 |
| JP | 2005184468 A | 7/2005 |
| JP | 2006303481 A | 11/2006 |
| JP | 2006339291 A | 12/2006 |
| JP | 2007049369 A | 2/2007 |
| JP | 2007104573 A | 4/2007 |
| JP | 2007165386 A | 6/2007 |
| JP | 2008277593 A | 11/2008 |
| JP | 2012195417 A | 10/2012 |
| JP | 2013-021031 A | 1/2013 |
| JP | 2014179448 A | 9/2014 |
| JP | 2015-225892 A | 12/2015 |
| JP | 2017-139258 A | 8/2017 |
| WO | 2017/134972 A1 | 8/2017 |

* cited by examiner

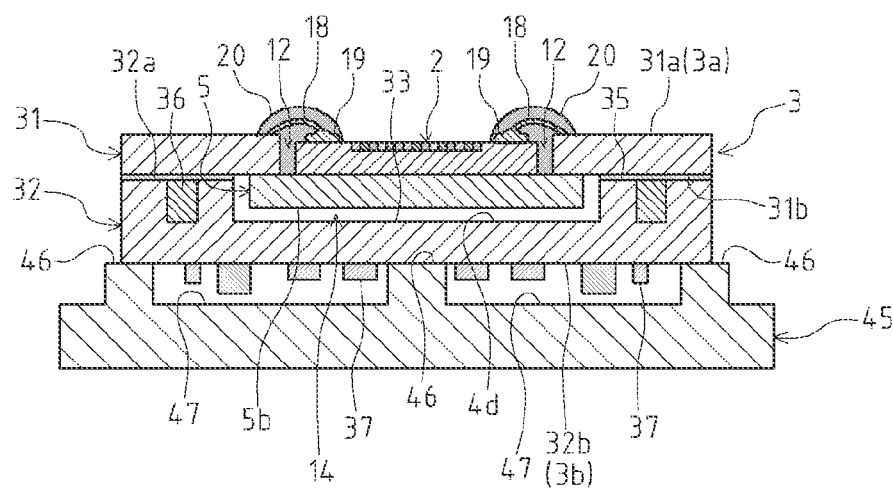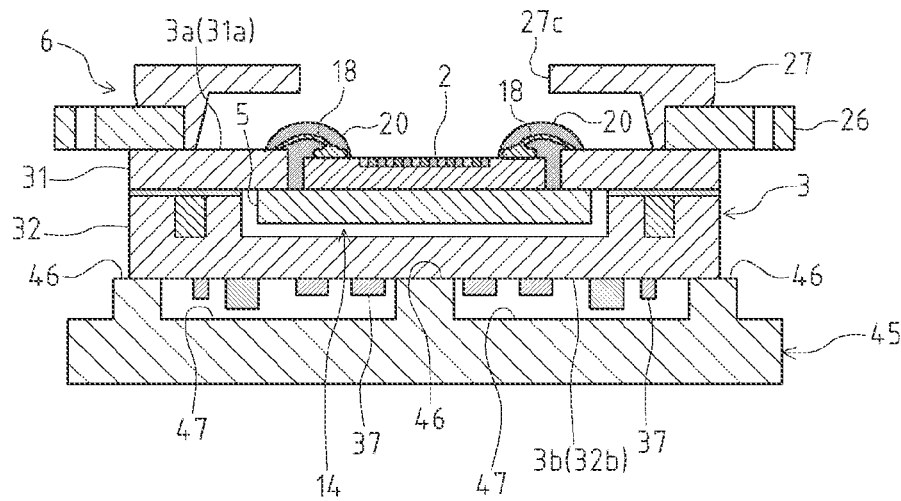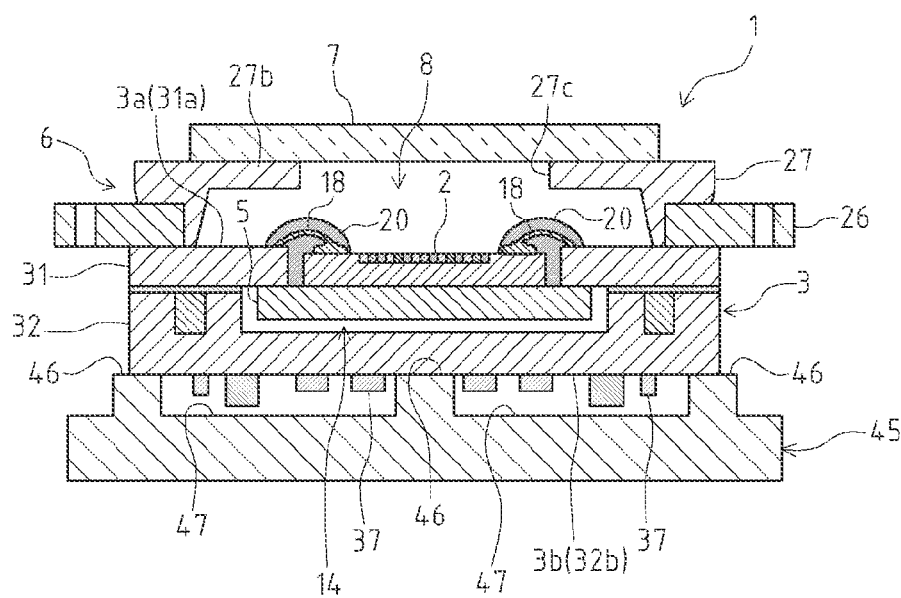

SEMICONDUCTOR DEVICE, ELECTRONIC APPARATUS, AND METHOD FOR MANUFACTURING SEMICONDUCTOR DEVICE

CROSS REFERENCE TO RELATED APPLICATIONS

This application is a U.S. National Phase of International Patent Application No. PCT/JP2019/025003 filed on Jun. 24, 2019, which claims priority benefit of Japanese Patent Application No. JP 2018-154708 filed in the Japan Patent Office on Aug. 21, 2018. Each of the above-referenced applications is hereby incorporated herein by reference in its entirety.

TECHNICAL FIELD

The present technology relates to a semiconductor device, an electronic apparatus, and a method for manufacturing a semiconductor device.

BACKGROUND ART

Conventionally, there has been a solid-state imaging device including an image sensor serving as a solid-state imaging element, which is an example of a semiconductor device. Some solid-state imaging devices have, for example, a so-called chip on board (COB) structure in which an image sensor is directly bonded with a die-bond material and the like, on a substrate formed by, for example, an organic material such as plastic, and a material such as ceramics, and the like (see, e.g., Patent Document 1).

The image sensor is a chip on which a plurality of light-receiving elements is formed on one plate surface side of a semiconductor substrate, such as silicon (Si). Examples of the image sensor include a complementary metal oxide semiconductor (CMOS) type sensor and a charge coupled device (CCD) type sensor. Patent Document 1 discloses a package structure provided with a protection cap formed by a glass and the like above the image sensor fixed onto the substrate via a hollow part.

In the configuration provided with the COB structure, a difference in coefficient of linear expansion between the image sensor, the die-bond material, and members of the substrate causes the occurrence of warpage of the image sensor, which is a sensor chip, and a change in the warpage occurred, which is an issue. The warpage of the image sensor and its change arise from a heat history during an assembly of the solid-state imaging device or an electronic apparatus including the solid-state imaging device, and from a change in surrounding environment during the use of assembled products.

Examples of the heat history during an assembly include heating in a reflow process for melting solder for junction in mounting the solid-state imaging device on a substrate. Further, examples of the change in surrounding environment after assembly include changes in temperature and humidity in a use environment of the products and its attendant change in an internal pressure of the hollow part in the package structure and the like.

In particular, in a case where a substrate is an organic substrate formed by an organic material, such as plastic, a difference in coefficient of linear expansion between the image sensor, which is a silicon chip, and the substrate becomes relatively high. Thus, the issue, the warpage of the image sensor, is apt to occur. The warpage of the image sensor and its change cause a drop in image quality provided by the solid-state imaging device.

Thus, the following configurations are proposed as a technology for reducing the warpage of the image sensor. Examples thereof include a configuration in which a substrate formed in a frame shape having a through hole and a metal plate provided on the undersurface side of the substrate so as to cover the through hole are provided, and an image sensor is arranged on the metal plate, as disclosed in Patent Document 2. In other words, the substrate is made in the frame shape and is bonded to the metal plate such that the metal plate forms the bottom part of the substrate, and the image sensor is provided on the metal plate so as to be positioned inside the through hole of the substrate.

CITATION LIST

Patent Document

Patent Document 1: Japanese Patent Application Laid-Open No. 2002-76313
Patent Document 2: Japanese Patent Application Laid-Open No. 2015-225892

SUMMARY OF THE INVENTION

Problems to be Solved by the Invention

Certainly, according to a conventional configuration in which the image sensor is provided with respect to the frame-shaped substrate via the metal plate as described above, since the image sensor is indirectly fixed to the substrate, warpage of the image sensor due to a difference in coefficient of linear expansion between the image sensor and the substrate is considered to be controllable. Such a configuration, however, has the following issues.

According to the conventional configuration, since the bottom surface side of the substrate is covered by the metal plate, an external terminal can be arranged only on, for example, the side surfaces and the like of a package structure, limiting an arrangement area of the external terminal, which is an issue. Moreover, peripheral components, such as a capacitor, a resistance, and a connector, cannot be mounted on the bottom surface side of the substrate which becomes the back surface side of the package structure, which is an issue.

The purpose of the present technology is to provide a semiconductor device, an electronic apparatus, and a method for manufacturing the semiconductor device that enable control of the occurrence of warpage of a sensor chip serving as a semiconductor element and a change in the warpage as well as prevention of limitation on an arrangement area of an external terminal and a peripheral component.

Solutions to Problems

A semiconductor device according to the present technology includes a semiconductor element in which one plate surface side of a semiconductor substrate is set as a light-receiving side, a substrate part having a recess, the recess being open to face a front surface side that is the light-receiving side and positioning the semiconductor element on the front surface side, and a plate shaped member positioned in the recess in a state where the plate shaped member is fixed to the substrate part, the plate shaped member fixing the semiconductor element to one plate surface side and being provided via a gap on at least another plate surface side with respect to a surface forming the recess.

Another aspect of the semiconductor device according to the present technology is the semiconductor device, in which the substrate part includes a first substrate having a frame shape forming a through opening, and a second substrate having a concavity in which a front surface side of the substrate part is set as an opening side, the second substrate being provided on a back surface side of the substrate part with respect to the first substrate and forming, with the concavity, the recess together with the through opening.

Another aspect of the semiconductor device according to the present technology is the semiconductor device, further including a thermal conduction part provided in a state of being in contact with both the plate shaped member and the substrate part, the thermal conduction part transferring heat of the plate shaped member to the substrate part.

Another aspect of the semiconductor device according to the present technology is the semiconductor device, in which the thermal conduction part is a filling resin part formed by a resin so as to fill a space part between the plate shaped member and the substrate part.

Another aspect of the semiconductor device according to the present technology is the semiconductor device, further including a connection member provided between a front surface of the semiconductor element and a front surface of the substrate part, the connection member electrically connecting the semiconductor element and the substrate part, in which, in a plate thickness direction of the semiconductor element, the front surface of the semiconductor element is positioned at a same position as a position of the front surface of the substrate part or at a position on a bottom side of the recess with reference to the front surface of the substrate part.

Another aspect of the semiconductor device according to the present technology is the semiconductor device, further including a resin part provided between the semiconductor element and the substrate part, the resin part coating the connection member.

An electronic apparatus according to the present technology includes a semiconductor device including a semiconductor element in which one plate surface side of a semiconductor substrate is set as a light-receiving side, a substrate part having a recess, the recess being open to face a front surface side that is the light-receiving side and positioning the semiconductor element on the front surface side, and a plate shaped member positioned in the recess in a state where the plate shaped member is fixed to the substrate part, the plate shaped member fixing the semiconductor element to one plate surface side and being provided via a gap on at least another plate surface side with respect to a surface forming the recess.

A method for manufacturing a semiconductor device according to the present technology, the method includes a step of attaching a plate shaped member to a back surface side of a first substrate having a frame shape forming a through opening, so as to cover the through opening, a step of fixing, onto a plate surface side of the plate shaped member, a semiconductor element in which one plate surface side of a semiconductor substrate is set as a light-receiving side, the plate surface side being a side that the through opening faces, and a step of attaching, to the back surface side of the first substrate, a second substrate having a concavity in which a front surface side is set as an opening side, such that the concavity forms a recess together with the through opening, and that a gap is formed between the plate shaped member and a surface forming the recess on at least a back surface side of the plate shaped member, the recess being open to face a front surface side that is the light-receiving side and positioning the semiconductor element on the front surface side.

Another aspect of the method for manufacturing the semiconductor device according to the present technology is the method for manufacturing the semiconductor device, further includes after the step of fixing the semiconductor element to the plate shaped member, a step of providing a connection member between a front surface of the semiconductor element and a front surface of the substrate part, the connection member electrically connecting the semiconductor element and the substrate part, and a step of providing a resin part between the semiconductor element and the substrate part, the resin part coating the connection member, in which, in a plate thickness direction of the semiconductor element, the front surface of the semiconductor element fixed to the plate shaped member through the step of fixing the semiconductor element to the plate shaped member is positioned at a same position as a position of the front surface of the substrate part or at a position on a bottom side of the recess with reference to the front surface of the substrate part.

BRIEF DESCRIPTION OF DRAWINGS

FIGS. 7A, 7B, and 7C are illustrative views of a method for manufacturing the solid-state imaging device according to the first exemplary embodiment of the present technology.

FIGS. 11A, 111B, and 11C are sectional side views illustrating a configuration of a variation of the solid-state imaging device according to the second exemplary embodiment of the present technology.

MODE FOR CARRYING OUT THE INVENTION

In providing a semiconductor element via a plate shaped member with respect to a substrate part, the present technology is directed to controlling the occurrence of warpage of a semiconductor and a change in the warpage by devising a configuration of the substrate part and an arrangement configuration and the like of the plate shaped member with respect to the substrate part. Moreover, the present technology is also directed to maintaining or improving a degree of flexibility in an arrangement area of external terminals and peripheral components on the substrate part.

Hereinafter, embodiments for implementing the present technology (hereinafter, referred to as "exemplary embodiment") will be described with reference to the drawings. Note that descriptions of exemplary embodiments will be provided in the following order.
1. A configuration example of a solid-state imaging device according to a first exemplary embodiment.
2. A method for manufacturing the solid-state imaging device according to the first exemplary embodiment.
3. A variation of the solid-state imaging device according to the first exemplary embodiment.
4. A configuration example of a solid-state imaging device according to a second exemplary embodiment.
5. A method for manufacturing the solid-state imaging device according to the second exemplary embodiment.
6. A variation of the solid-state imaging device according to the second exemplary embodiment.
7. A configuration example of an electronic apparatus.

<Configuration Example of Solid-State Imaging Device According to First Exemplary Embodiment>

Figure 1:
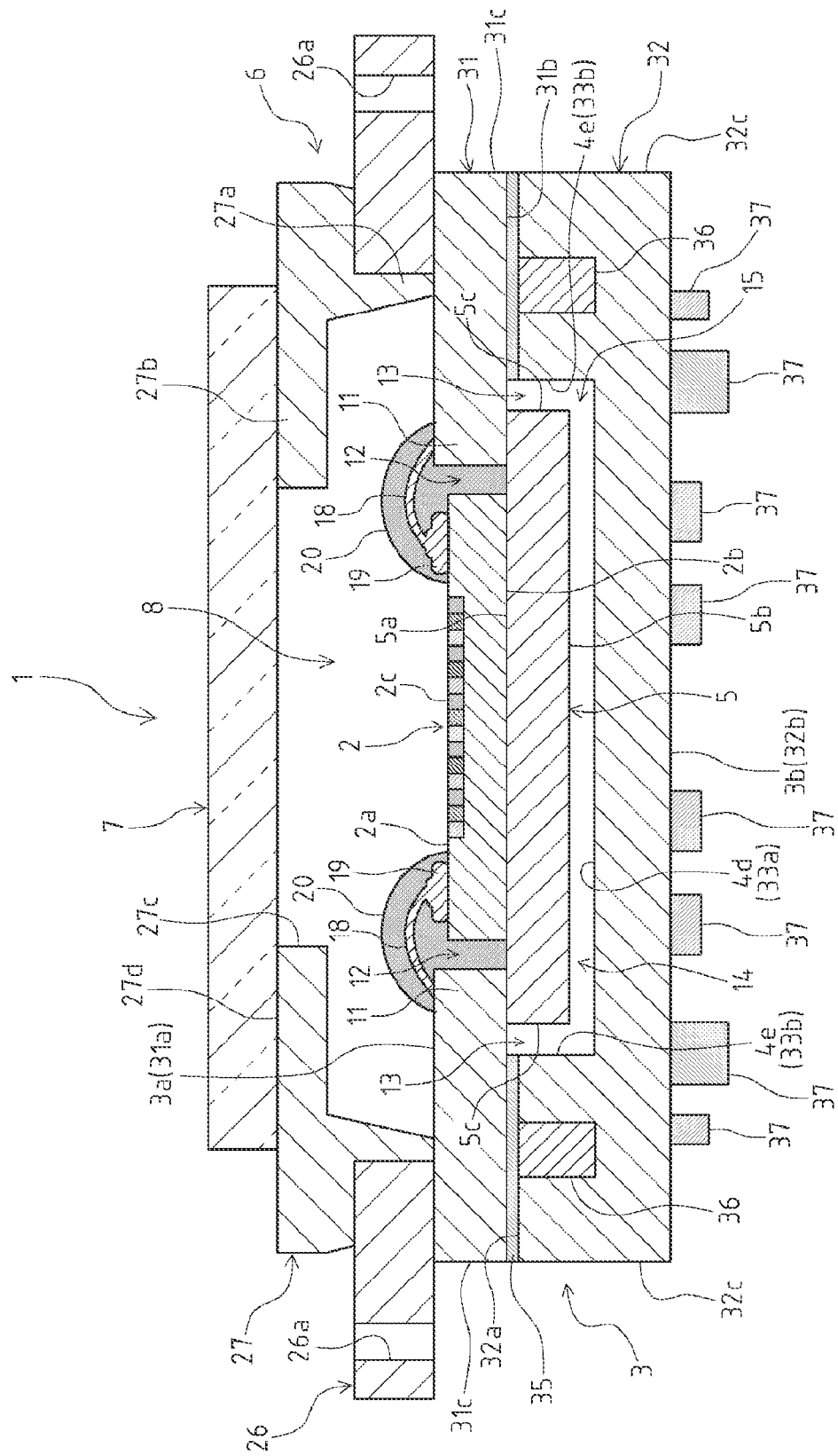
FIG. 1 is a sectional side view illustrating a configuration of a solid-state imaging device according to a first exemplary embodiment of the present technology.

A configuration example of a solid-state imaging device 1 serving as a semiconductor device according to a first exemplary embodiment of the present technology will be described with reference to FIG. 1 to FIG. 5. As illustrated in FIG. 1, the solid-state imaging device 1 includes an image sensor 2 serving as a solid-state imaging element which is a semiconductor element, a substrate part 3 in which a recess 4 is formed, a metal plate 5 which is a plate shaped member supporting the image sensor 2 with respect to the substrate part 3. The solid-state imaging device 1 further includes a frame 6 provided on the substrate part 3 and a glass 7 which is a translucent member and is supported on the frame 6.

The substrate part 3 has a front surface 3a which is one plate surface, and a back surface 3b which is the other plate surface opposite to the front surface 3a. The image sensor 2 is provided in a state where a light-receiving surface faces the front surface of the substrate part 3 in the recess 4 of the substrate part 3.

With such a configuration, the solid-state imaging device 1 mounts the glass 7 on the substrate part 3 via the frame 6, and is provided with a package structure including a cavity 8 between the image sensor 2 and the glass 7. In other words, the glass 7 is provided above the image sensor 2 to face the image sensor 2, and the cavity 8 which is an enclosed space formed by the frame 6 and the glass 7 is formed on the substrate part 3.

The image sensor 2 includes a silicon semiconductor substrate formed by silicon (Si), which is an example of a semiconductor, and one plate surface side of the semiconductor substrate (upper side in FIG. 1) serves as a light-receiving side. The image sensor 2 is a rectangular plate shaped chip, and has a front surface 2a that is the plate surface serving as the light-receiving side and a back surface 2b that is the plate surface opposite to the front surface 2a. The image sensor 2 according to the present exemplary embodiment is a CMOS type image sensor. In other words, the solid-state imaging device 1 is a CMOS solid-state imaging device. Note that the image sensor 2 may be a CCD type image sensor.

Most parts of the image sensor 2 are formed by the semiconductor substrate, and an image sensor element is formed on the front surface 2a side. More specifically, the image sensor 2 has, on the front surface 2a side, a pixel region 2c which serves as a light-receiving unit and is a light-receiving region including a large number of pixels formed in a predetermined array, such as a Bayer array, and has a peripheral region around the pixel region 2c. The pixel region 2c includes an effective pixel region that performs generation of a signal charge through photoelectric conversion in each pixel, amplification, and reading.

The pixels in the pixel region 2c each includes a plurality of pixel transistors and a photodiode serving as a photoelectric conversion unit having a photoelectric conversion function. The photodiode has a light-receiving surface that receives light incident from the front surface 2a side of the image sensor 2, and generates a signal charge of a quantity corresponding to a quantity (intensity) of light incident on the light-receiving surface. The plurality of pixel transistors has, for example, MOS transistors individually in charge of amplification, transfer, selection, and reset of the signal charge generated by the photodiode. Note that, regarding a plurality of pixels, a shared-pixel structure may be used in which a photodiode and a transfer transistor included in a plurality of unit pixels share another individual pixel transistor.

On the front surface 2a side of the image sensor 2, a color filter and an on-chip lens are formed to correspond to each pixel via an antireflection film formed by an oxide film and the like and a flattening film formed by an organic material, with respect to the semiconductor substrate. The photodiode receives light incident on the on-chip lens via the color filter and the flattening film and the like.

Examples of the configuration of the image sensor 2 includes a front side illumination type in which the pixel region 2c is formed on the front surface side of the semiconductor substrate, and a back side illumination type in which, in order to improve the transmittance of light, the photodiode and the like are arranged upside down and the back surface side of the semiconductor substrate serves as a light-receiving surface side. The examples further include a single chip type in which a peripheral circuit of a pixel group is stacked. Note that the image sensor 2 according to the present technology is not limited to these configurations.

The substrate part 3 is formed by, for example, an organic material, such as plastic, and a material such as ceramics. The substrate part 3 has a rectangular plate outer form as a whole, and has the recess 4 which is open to face the front surface 3a side, which is the light-receiving side of the image sensor 2. The recess 4 positions the image sensor 2 on the front surface 3a side. The recess 4 forms a flat space part which has a rectangular shape along the rectangular outer form of the substrate part 3 in a planar view and is parallel to a plate surface of the substrate part 3. The recess 4 is formed to be open to the front surface 3a.

Figure 2:
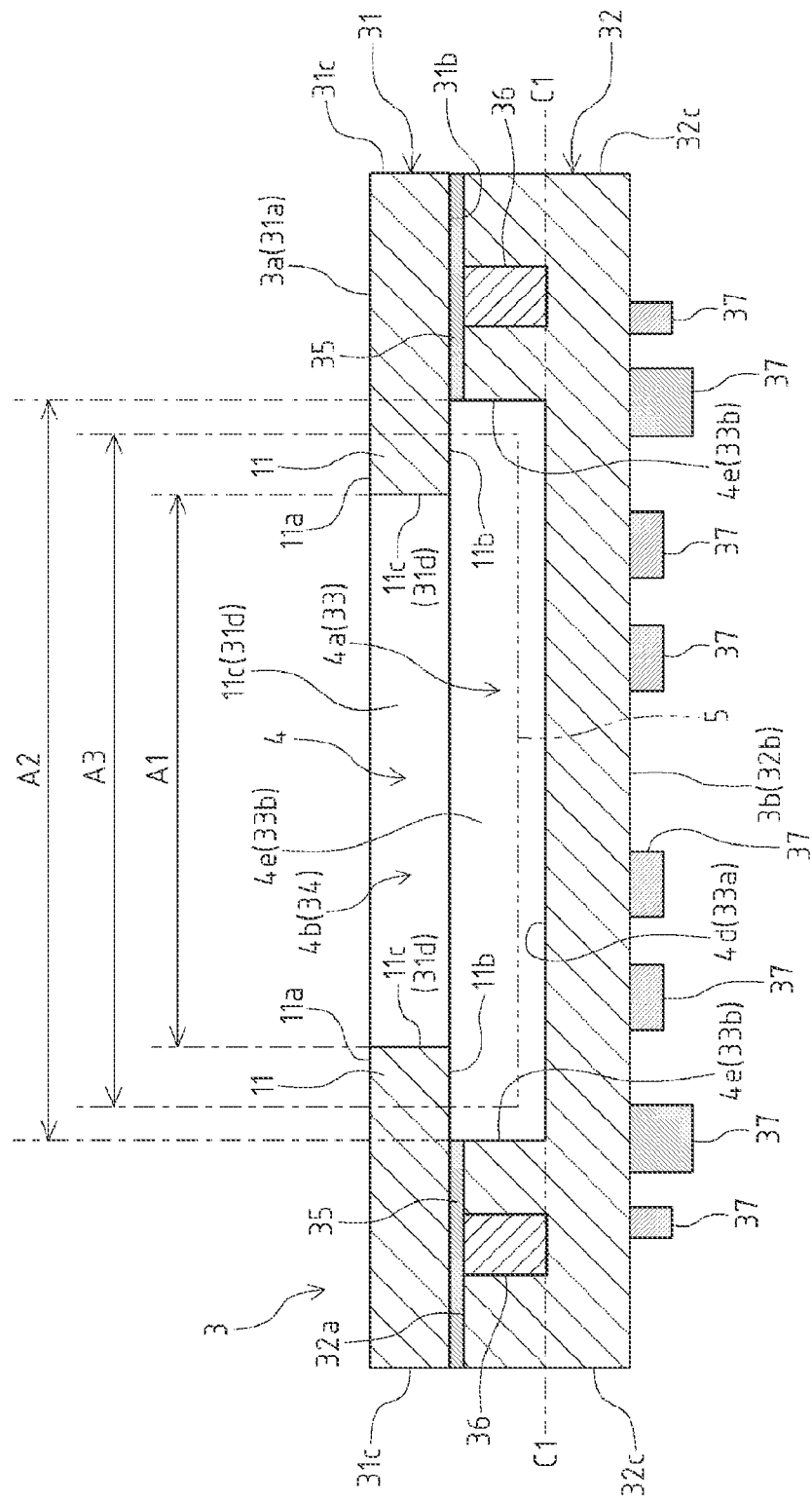
FIG. 2 is a sectional side view illustrating a configuration of a substrate part according to the first exemplary embodiment of the present technology.

As illustrated in FIG. 2, the recess 4 includes, as the space part formed in the substrate part 3, a lower space portion 4a which is substantially a lower half of the recess 4, and an upper space portion 4b which is substantially an upper half of the recess 4 and is a size smaller than the lower space portion 4a in the planar view. More specifically, in the recess 4, a width dimension A1 of the upper space portion 4b forming an upper opening portion of the recess 4 is less than a width dimension A2 of the lower space portion 4a. In such a manner, the recess 4 is formed by the space part including upper and lower stages having different outer form areas in the planar view, with the lower space portion 4a and the upper space portion 4b smaller in outer form area in the planar view than the lower space portion 4a.

The substrate part 3, in which such a recess 4 is formed, has overhangs 11 as parts forming the upper space portion 4b of the recess 4. The overhangs 11 are parts forming the upper opening portion of the recess 4, and are formed along the four sides of a rectangular shape in the planar view. The overhangs 11 narrow the outer form of the upper space portion 4b in the planar view compared with the lower space portion 4a. The overhangs 11 have upper surfaces 11a forming an inner side opening edge part of the front surface 3a in the substrate part 3, undersurfaces 11b which are the opposite surfaces of the upper surfaces 11a, and inner side surfaces 11c which are surfaces substantially perpendicular to the upper surfaces 11a and the undersurfaces 11b and form the upper space portion 4b.

Moreover, the lower space portion 4a of the recess 4 is a space part formed by, in the recess 4, a bottom surface 4d formed substantially parallel to the back surface 3b of the substrate part 3 and the like, lower inner side surfaces 4e substantially perpendicular to the bottom surface 4d, and the undersurfaces 11b of the overhangs 11. Furthermore, the upper space portion 4b of the recess 4 is a space part formed by the four inner side surfaces 11c of the overhangs 11.

The metal plate 5 is a rectangular plate shaped member formed by a metal material. The metal plate 5 has an upper surface 5a which is one plate surface, an undersurface 5b which is another plate surface, and four side surfaces 5c having a rectangular outer form in the planar view. Examples of the metal materials used for a material of the metal plate 5 include stainless steel (SUS), Fe—Ni—Co alloy, 42 Alloy, copper (Cu), a copper alloy, and the like.

The metal plate 5 is positioned in the recess 4 in a state where the metal plate 5 is fixed to the substrate part 3, and fixes the image sensor 2 on the upper surface 5a side. The metal plate 5 is provided in the recess 4 such that the plate surface thereof is oriented substantially parallel to the front surface 3a and the back surface 3b of the substrate part 3. A plate thickness of the metal plate 5 is, as merely an example, a predetermined dimension within a range of from 100 μm to 200 μm in a case where a plate thickness of the image sensor 2 is a predetermined dimension within a range of from 300 μm to 600 μm.

In terms of a dimension of an outer form in the planar view, the metal plate 5 has a dimension which is a size smaller than that of the outer form in the planar view of the lower space portion 4a of the recess 4, and has a dimension which is a size larger than the outer form in the planar view of the upper opening portion (the upper space portion 4b) of the recess 4. In a sectional view illustrated in FIG. 2, a width dimension A3 of the metal plate 5 is larger than the width dimension A1 of the upper space portion 4b, which is a face-to-face dimension of the facing inner side surfaces 11c of the overhangs 11, and is smaller than the width dimension A2 of the lower space portion 4a, which is a face-to-face dimension of the facing lower inner side surfaces 4e.

Moreover, the metal plate 5 is fixed to the substrate part 3 in a form where a periphery portion of the upper surface 5a is in contact with the undersurfaces 11b of the overhangs 11 of the substrate part 3. The periphery portion of the upper surface 5a is a portion outside a region in which the image sensor 2 is fixed to the upper surface 5a of the metal plate 5. The metal plate 5 larger than an opening area of the recess 4 is positioned below the overhangs 11, and the outer edge forming the rectangular outer form in the planar view is positioned outside the inner side surfaces 11c of the overhangs 11 forming the upper space portion 4b of the recess 4. A part of an outer edge portion of the metal plate 5 overlapping the overhangs 11 is fixed to the overhangs 11 from below. In other words, the metal plate 5 is provided in a form where the outer edge portion along the rectangular outer form of the metal plate 5 serves as a fixing portion for the substrate part 3, and where an opening portion formed by the overhangs 11 is blocked from below.

The metal plate 5 is fixed to the overhangs 11 by adhesion with, for example, a die-bond material, which is a resin type adhesive. Examples of the adhesive for fixing the metal plate 5 to the substrate part 3 include an epoxy resin type adhesive, an acrylic resin type adhesive, and the like. Note that a method for fixing the metal plate 5 to the substrate part 3 is not particularly limited, and means other than fixation using an adhesive may be used.

The metal plate 5, which is provided in the recess 4 by being fixed to the overhangs 11 from below in such a manner, is positioned inside the lower space portion 4a of the recess 4. In a state where the metal plate 5 is fixed to the substrate part 3, the upper surface 5a is positioned at the same height position as that of the undersurfaces 11b of the overhangs 11 in a thickness direction (vertical direction) of the substrate part 3, and the upper surface 5a faces an upper side from the upper opening portion of the recess 4. The upper surface 5a of the metal plate 5, which faces the upper side from the recess 4 in such a manner, becomes a surface for mounting the image sensor 2.

The image sensor 2 is a size smaller than the opening area of the recess 4, and forms a gap 12 between the image sensor 2 and each of the inner side surfaces 11c of the overhangs 11 along a rectangular outer form in the planar view in a state where the image sensor 2 is fixed on the metal plate 5. More specifically, side surfaces 2d of the image sensor 2 are spaced from the inner side surfaces 11c of the overhangs 11, and the gaps 12 are each formed between these surfaces. The gaps 12 are formed all around the image sensor 2 at substantially regular intervals, for example.

The image sensor 2 is fixed to the upper surface 5a of the metal plate 5 by being die bonded by using, for example, the die-bond material, which is a resin type adhesive. The image sensor 2 is provided at a position at which a central position of the image sensor 2 coincides with, for example, a central position of the metal plate 5 in a planar direction.

The metal plate 5 is a size smaller than the outer form of the lower space portion 4a of the recess 4 in the planar view, and forms a side gap 13 between the metal plate 5 and each of the lower inner side surfaces 4e forming the lower space portion 4a along a rectangular outer form in the planar view, in a state where the metal plate 5 is fixed to the substrate part 3. More specifically, the side surfaces 5c of the metal plate 5 are spaced from the lower inner side surfaces 4e, and the side gaps 13 are each formed between these surfaces. The side gaps 13 are formed all around the metal plate 5 at substantially regular intervals, for example.

Figure 4:
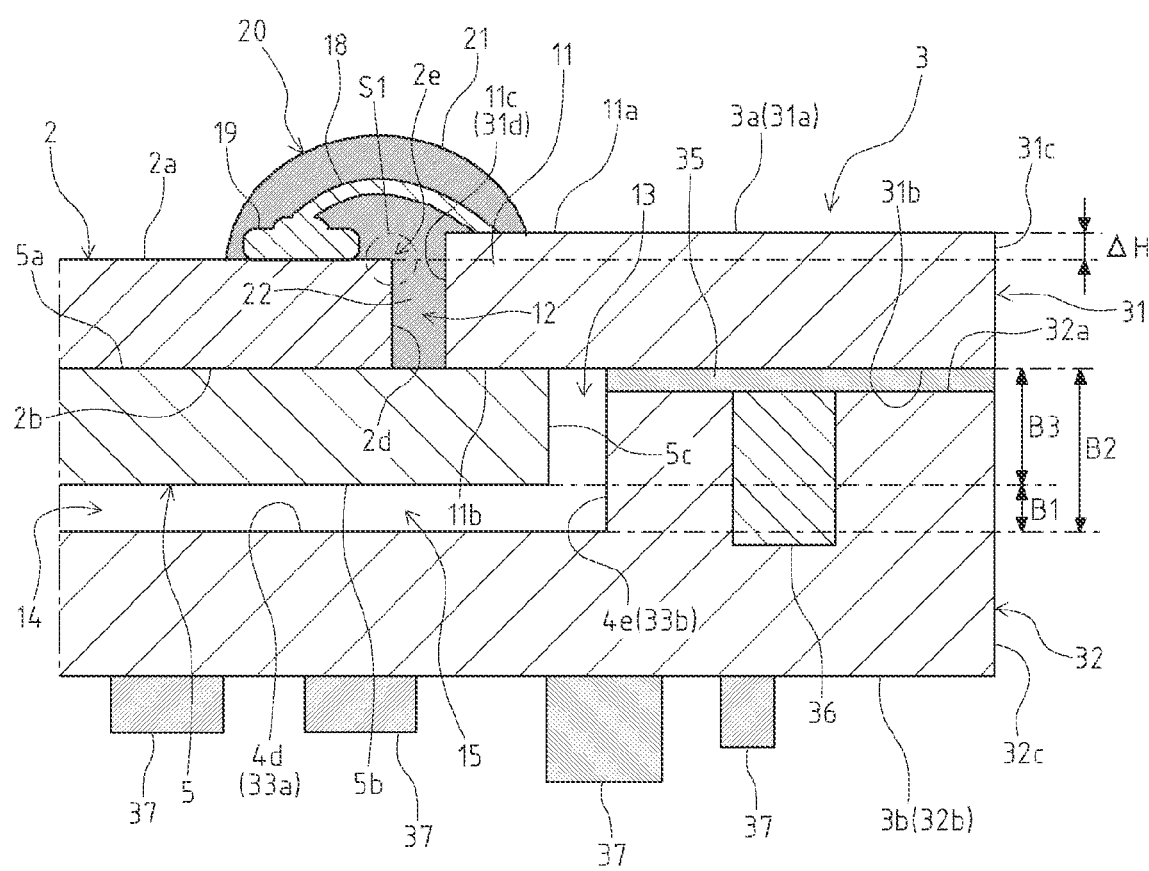
FIG. 4 is a partially enlarged sectional side view illustrating the configuration of supporting the image sensor according to the first exemplary embodiment of the present technology.

A thickness dimension of the metal plate 5 is smaller than a dimension of the lower space portion 4a of the recess 4 in the vertical direction, i.e., a face-to-face dimension of the bottom surface 4d and each of the undersurfaces 11b. Thus, a lower gap 14 is formed under the metal plate 5 in a state where the metal plate 5 is fixed to the undersurfaces 11b of the overhangs 11. More specifically, the lower gap 14 is an interstice in a planar shape (slit shape in a sectional view) between the undersurface 5b of the metal plate 5 and the bottom surface 4d of the recess 4. Accordingly, a gap dimension B1 of the lower gap 14 is a dimension obtained by subtracting a thickness dimension B3 of the metal plate 5 from a face-to-face dimension B2 of the bottom surface 4d and each of the undersurfaces 11b, as illustrated in FIG. 4.

In such a manner, the metal plate 5 is provided with respect to the bottom surface 4d, which is a surface forming the recess 4 on the undersurface 5b side, via a gap (lower gap 14). In the present exemplary embodiment, the side gaps 13 are present on the lateral side of the metal plate 5 between the metal plate 5 and the surface forming the recess 4 as described above.

Thus, a hollow part 15 in contiguous with the respective side gaps 13 and the lower gap 14 is formed between the metal plate 5 and the surface forming the recess 4. The hollow part 15 has, as its space shape, a flat box shape having a portion of the lower gap 14 as a bottom surface part and a portion of the side gaps 13 as a side wall part. The gap dimensions (slid widths) of the respective side gaps 13 and the lower gap 14 each are a predetermined dimension within a range of from 50 μm to 100 μm in a case where the plate thickness of the metal plate 5 is a predetermined dimension within a range of from 100 μm to 200 μm, which is merely an example.

As described above, the solid-state imaging device 1 according to the present exemplary embodiment includes the metal plate 5 provided in a state where the metal plate 5 is floating above the substrate part 3 by only the periphery portion of the upper surface 5a being bonded to the overhangs 11 through adhesion, and is provided with a configuration in which the image sensor 2 is mounted on the metal plate 5 with the image sensor 2 upwardly exposed. Note that, while the side gaps 13 are formed in the lateral sides of the metal plate 5 in the present exemplary embodiment, it is only required that the metal plate 5 is provided with respect to the bottom surface 4d of the recess 4 via a gap at least on the undersurface 5b side.

Further, the solid-state imaging device 1 includes bonding wires 18 which are each a connection member for electrically connecting the image sensor 2 and the substrate part 3. The bonding wires 18 are each provided to span between the front surface 2a of the image sensor 2 (hereinafter, referred to as "sensor front surface 2a") and the front surface 3a of the substrate part 3 (hereinafter, referred to as "substrate front surface 3a") to form a convexly curved shape or a bending shape, such as an arch, on the upper side.

The bonding wires 18 are each a metal small-gage wire formed by, for example, gold (Au) or copper (Cu). Each bonding wire 18 electrically connects respective pad electrodes 19 formed on the front surface 2a of the image sensor 2 to respective electrodes formed on the substrate front surface 3a, not illustrated. The plurality of bonding wires 18 corresponding in number to the pad electrodes 19 is provided. Note that the pad electrodes 19 are each a terminal for transmitting and receiving signals from or to outside, and is formed by, for example, an aluminum material and the like.

Further, the solid-state imaging device 1 according to the present exemplary embodiment includes resin protective parts 20 which are each a resin part coating the respective bonding wires 18. The resin protective parts 20 are each provided so as to fill the respective gaps 12 between the image sensor 2 and the substrate part 3 and also to coat the entire respective bonding wires 18.

Figure 3:
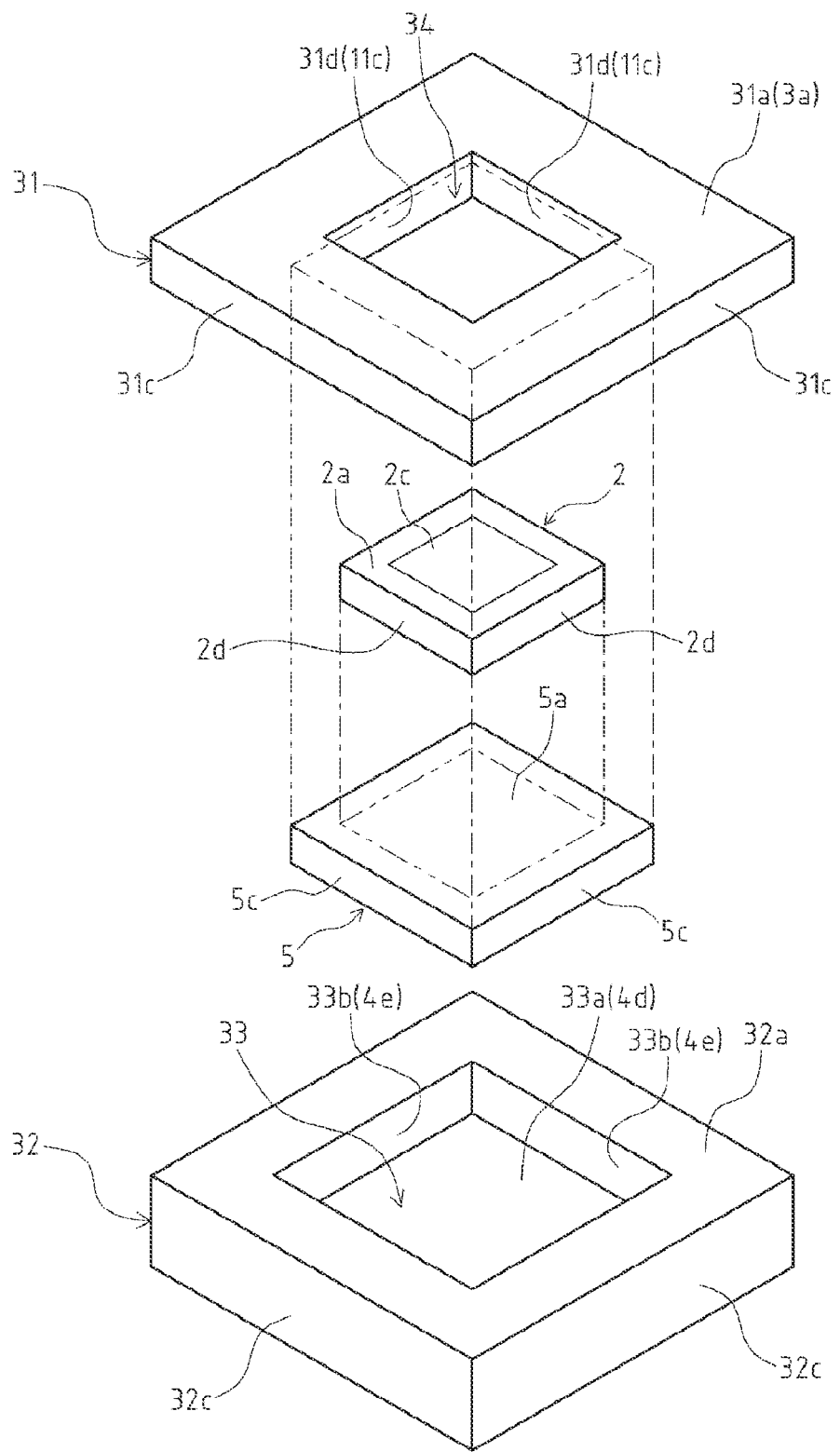
FIG. 3 is an exploded perspective view schematically illustrating a configuration of a substrate part of the solid-state imaging device and a configuration of supporting an image sensor thereof according to the first exemplary embodiment of the present technology.

The resin protective parts 20 are formed to have a protuberance so as to include the entire respective bonding wires 18, in correspondence with the convexly curved shape or the bending shape on the upper side of the bonding wire 18. Thus, the resin protective parts 20 each include a coating part 21 which is a portion forming an upper part of the resin protective parts 20 and has a swelling or a domical shape coating the bonding wire 18, as illustrated in FIG. 3. Each resin protective part 20 further includes a buried part 22 which is a portion forming a lower part of the resin protective part 20 and is present in the respective gaps 12. The buried part 22 is a portion downwardly protruding from the lower side of the coating part 21, and is present between the respective side surfaces 2d and the respective inner side surfaces 11c on the outside of the image sensor 2 on the upper surface 5a of the metal plate 5.

A resin material which is used for, for example, a mold material, is used as a material of the resin protective parts 20. Specifically, examples of the material of the resin protective parts 20 include a thermosetting resin, such as an epoxy resin, a material obtained by dispersing filler having silicon oxide as the main ingredient into the thermosetting resin.

For the material of the resin protective parts 20, it is desirable to use a resin material having such physical properties that absorb light, from the viewpoint of preventing the occurrence of a flare due to light that has transmitted through the glass 7 and then reflected on the front surface of the resin protective parts 20 being incident on the light-receiving unit of the image sensor 2. Moreover, application of surface texturing, such as matte finish, to the surface of the resin protective parts 20 is effective from the viewpoint of preventing the occurrence of the flare.

The frame 6 has a base plate part 26 formed by a metal material and a support frame part 27 formed by a resin material. The base plate part 26 is a rectangular frame shaped member, and has an outer form dimension larger than the dimension of the outer form in the planar view of the substrate part 3. The outer form dimension of an inner opening of the base plate part 26 is smaller than the dimension of the outer form in the planar view of the substrate part 3.

The frame 6 is fixed onto the substrate front surface 3a with an adhesive, such as an epoxy resin type adhesive and an acrylic resin type adhesive. The frame 6 is provided without interfering the bonding wire 18 and the resin protective part 20, with a periphery portion of the substrate front surface 3a serving as a support surface portion.

An outer circumference portion of the base plate part 26, having a frame shape, outwardly overhangs the substrate part 3 to form an eave-like shape. Moreover, an internal circumference portion of the base plate part 26 is positioned at an outer circumference portion of the substrate front surface 3a. On the overhang portion on the outer circumference side of the base plate part 26, holes 26a for fastening bolts are formed. The bolts are used for mounting the solid-state imaging device 1 to other devices, or used for the solid-state imaging device 1 to receive installation of other devices.

The support frame part 27 includes a base support part 27a which receives installation of the base plate part 26, and a support body part 27b which is provided on the upper side of the base support part 27a and supports the glass 7. The support body part 27b is a flat shaped part provided substantially parallel to the substrate front surface 3a, and has a through opening 27c at a center portion thereof. The opening 27c includes the entire pixel region 2c of the image sensor 2 within the confines of the opening in the planar view. An upper surface part 27d of the support body part 27b becomes a portion for supporting the glass 7.

Note that the configuration of the frame 6 is not limited to the present exemplary embodiment. The frame 6 may have, for example, a configuration generally including metal members or a configuration generally including resin materials, instead of a combination structure including the metal base plate part 26 and the resin support frame part 27 as in the present exemplary embodiment.

The glass 7, which is an example of a transparent member, is a member having a rectangular plate shape larger than the shape of the image sensor 2. The glass 7 is provided on the support body part 27b of the frame 6, so that the glass 7 is provided substantially parallel to the image sensor 2 via a predetermined interval above the light-receiving side of the image sensor 2. The glass 7 is fixed to the support body part 27b with an adhesive or the like.

The glass 7 is provided on the support body part 27b of the frame 6 so as to cover the entire opening 27c from above. Thus, the glass 7 has an outer form dimension larger than the opening dimension of the opening 27c. In such a way, the glass 7 is provided above the image sensor 2 to face the sensor front surface 2a via the opening 27c.

The glass 7 allows various types of light incident from an optical system, such as a lens, generally positioned above the glass 7 to pass through to convey the light to the light-receiving surface of the image sensor 2 via the cavity 8. The glass 7 has the function of protecting the light-receiving surface side of the image sensor 2 as well as the function of blocking water (water vapor), dust, and the like from outside from intruding into the cavity 8 in cooperation with the frame 6. Further, the cavity 8 becomes a space part that is completely isolated and protected from outside on the image sensor 2. Further, in place of the glass 7, a plastic plate, a silicon plate that allows only infrared light to pass through, or the like can be used, for example.

In the solid-state imaging device 1 provided with such a structure as described above, the light that has passed through the glass 7 travels in the cavity 8, and is received and detected by a light-receiving element included in each pixel arranged on the pixel region 2c of the image sensor 2.

Next, the configuration of the substrate part 3 according to the present exemplary embodiment will be described in detail. The substrate part 3 according to the present exemplary embodiment includes a frame substrate 31 which is a first substrate, and a cavity substrate 32 which is a second substrate, as illustrated in FIG. 1 to FIG. 4. The substrate part 3 has a division structure in which these substrates are integrally joined as division elements.

The cavity substrate 32 forms the back surface 3b of the substrate part 3 and also the substrate front surface 3a side, that is, the cavity substrate 32 has a concavity 33 with an opening side on the upper side. The cavity substrate 32 has a shape along a rectangular plate outer form as a whole, and the concavity 33 on an upper surface 32a. The concavity 33 is a hollow portion forming a rectangular shape along the outer form of the cavity substrate 32 in the planar view.

Thus, the cavity substrate 32 has a substantially flat box shape with an opening side on the upper side, and the upper surface 32a of the cavity substrate 32 has a flat surface having a rectangular frame shape in the planar view. An undersurface 32b of the cavity substrate 32 has a substantially horizontal surface as a whole, and forms the back surface 3b of the substrate part 3.

The cavity substrate 32 forms the rectangular outer shape of the substrate part 3 in the planar view, and also forms a lower part of the substrate part 3. Thus, outer surfaces 32c of the cavity substrate 32 form lower parts of the side surfaces of the substrate part 3. The plate thickness of the cavity substrate 32 is, for example, about two-thirds of the entire thickness of the substrate part 3.

The concavity 33 includes a bottom surface 33a having a substantially horizontal surface and a rectangular shape, and side wall surfaces 33b which are substantially perpendicular to the bottom surface 33a. The bottom surface 33a of the concavity 33 becomes the bottom surface 4d of the recess 4, and the side wall surfaces 33b of the concavity 33 become the lower inner side surfaces 4e of the recess 4. The cavity substrate 32 is provided on the back surface 3b side of the substrate part 3 with respect to the frame substrate 31, that is, below the frame substrate 31. The cavity substrate 32 forms, with the concavity 33, the recess 4 of the substrate part 3 together with a frame opening 34 of the frame substrate 31.

The cavity substrate 32 may have, for example, a laminated structure including a plurality of layers. The cavity substrate 32 may be formed by, for example, division elements with a position indicated by, for example, symbol C1-C1 in FIG. 2 set as a position for dividing the upper and lower sides. In such a case, the cavity substrate 32 has a structure in which a rectangular plate shaped portion forming the undersurface 32b and the bottom surface 33a of the concavity 33, and a frame shaped portion forming the side wall surfaces 33b of the concavity 33 are integrally joined.

The frame substrate 31 has a frame shape forming the frame opening 34 which is a through opening. Thus, the frame substrate 31 has four side parts forming a frame shape. The frame substrate 31 is provided on the upper surface 32a side of the cavity substrate 32, and forms the recess 4 of the substrate part 3 together with the concavity 33.

The frame substrate 31 has a shape along a rectangular plate outer form as a whole, and has an upper surface 31a and the undersurface 31b which have the same frame shape as an outer form in the planar view. The upper surface 31a of the frame substrate 31 becomes the substrate front surface 3a. The frame substrate 31 forms the rectangular frame opening 34 with the four side parts forming the frame shape.

The frame substrate 31 forms the rectangular outer shape of the substrate part 3 in the planar view, and also forms an upper part of the substrate part 3. Thus, outer surfaces 31c of the frame substrate 31 form upper parts of the side surfaces of the substrate part 3. The plate thickness of the frame substrate 31 is, for example, about one-third of the entire thickness of the substrate part 3.

The frame opening 34 is formed by inner side surfaces 31d of the four side parts of the frame substrate 31. The inner side surfaces 31d are substantially perpendicular to the upper surface 31a. The inner side surfaces 31d of the frame substrate 31 become the inner side surfaces 11c of the overhangs 11 forming the upper space portion 4b of the recess 4. More specifically, the frame substrate 31 has the frame opening 34 with an opening dimension which is a size smaller than the opening dimension of the concavity 33 of the cavity substrate 32, so that an internal circumference edge part inwardly overhangs the upper surface 32a of the cavity substrate 32 in an eave-like shape, as the overhangs 11. Moreover, the frame substrate 31 forms, with the frame opening 34, the recess 4 of the substrate part 3 together with the concavity 33 of the cavity substrate 32.

The frame substrate 31 and the cavity substrate 32 are joined, with the undersurface 31b of the frame substrate 31 and the upper surface 32a of the cavity substrate 32 set as a joining surface, and form the substrate part 3. The frame substrate 31 and the cavity substrate 32 are electrically connected via a conductive sheet 35 interposed between the undersurface 31b of the frame substrate 31 and the upper surface 32a of the cavity substrate 32. The conductive sheet 35 has, for example, a rectangular frame shape to match the shape of the upper surface 32a of the cavity substrate 32.

The conductive sheet 35 ensures an electrical connection between the frame substrate 31 and the cavity substrate 32. The conductive sheet 35 is, for example, electrically connected to an electrode on the substrate front surface 3a connected to another end of the respective bonding wires 18 via wiring and the like formed in the frame substrate 31. The conductive sheet 35 electrically connects electrode terminals which are formed to face the undersurface 31b of the frame substrate 31 (illustration is omitted) to electrodes 36 formed to face the upper surface 32a of the cavity substrate 32.

Further, peripheral components 37, such as a capacitor, a resistance, and a connector, are arranged on the back surface 3b of the substrate part 3. The peripheral components 37 are provided to protrude from the back surface 3b. A connector, which serves as a peripheral component 37, is an electric connection part for a circuit substrate or the like on which the solid-state imaging device 1 is mounted.

The solid-state imaging device 1 according to the present exemplary embodiment has a configuration as described below, regarding a relationship between the image sensor 2 and the substrate part 3. Specifically, the sensor front surface 2a is positioned on the bottom side of the recess 4 with reference to the substrate front surface 3a in a plate thickness direction of the image sensor 2, i.e., the vertical direction. In other words, the sensor front surface 2a is positioned below the substrate front surface 3a.

More specifically, in the configuration in which the sensor front surface 2a is positioned below the substrate front surface 3a in the vertical direction, a height position of the sensor front surface 2a is positioned ΔH lower than a height position of the substrate front surface 3a, as illustrated in FIG. 4. Thus, the height of the respective side surfaces 2d of the image sensor 2 is ΔH lower than the height of the respective inner side surfaces 11c of the overhangs 11, with reference to the upper surface 5a of the metal plate 5.

Figure 5:
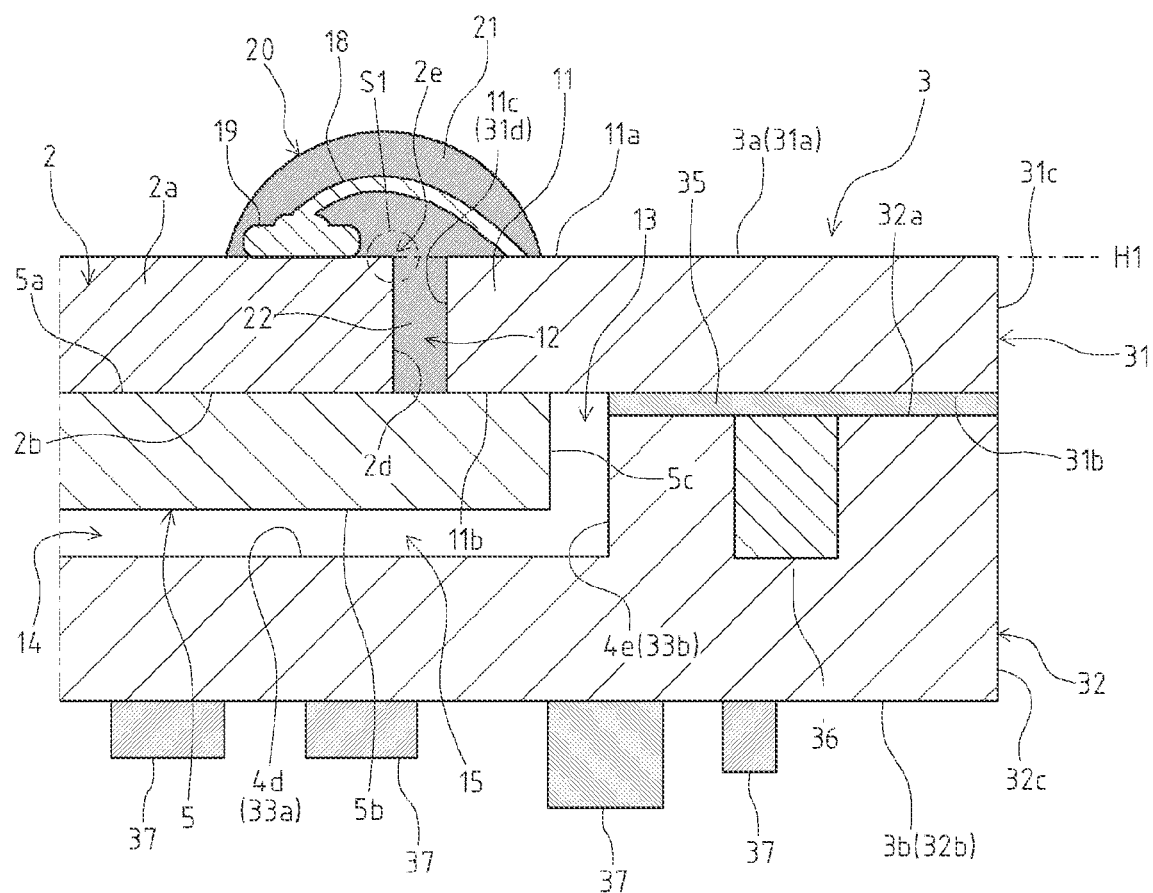
FIG. 5 is a partially enlarged sectional side view illustrating another example of the configuration of supporting the image sensor according to the first exemplary embodiment of the present technology.

Alternatively, a configuration may be employed in which the sensor front surface 2a is positioned at the same position as the substrate front surface 3a in the vertical direction, as illustrated in FIG. 5. In such a configuration, the sensor front surface 2a and the substrate front surface 3a are positioned at a common height position H1 so as to be brought into line with a predetermined horizontal surface. Thus, the side surfaces 2d of the image sensor 2 and the inner side surfaces 11c of the overhangs 11, which form the gaps 12 around the image sensor 2 to face each other, are level with each other with reference to the upper surface 5a of the metal plate 5.

<2. Method for Manufacturing Solid-State Imaging Device According to First Exemplary Embodiment>

An example of a method for manufacturing the solid-state imaging device 1 according to the first exemplary embodiment of the present technology will be described with reference to FIGS. 6A, 6B, 6C, 6D, 7A, 7B, and 7C.

Figure 6A:
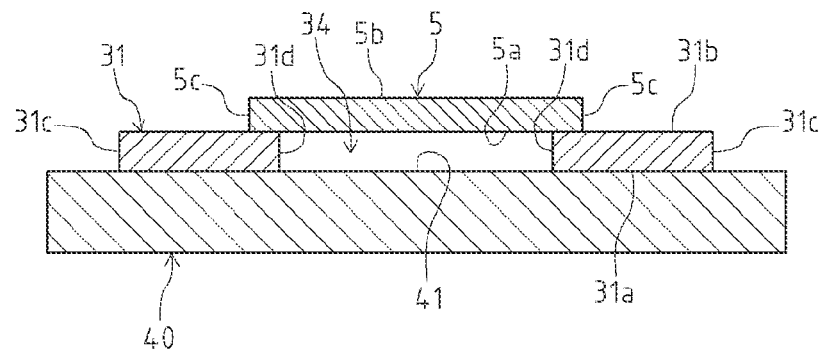
FIGS. 6A, 6B, 6C, and 6D are illustrative views of a method for manufacturing the solid-state imaging device according to the first exemplary embodiment of the present technology.

Initially, the metal plate 5 is bonded as illustrated in FIG. 6A. Specifically, the frame substrate 31 and the metal plate 5 are prepared, and a step of attaching the metal plate 5 is performed such that the metal plate 5 is attached to the frame substrate 31 having the frame opening 34, on the undersurface 31b side which is the back surface side of the frame substrate 31, so as to cover the frame opening 34.

The attachment of the metal plate 5 to the frame substrate 31 is performed on an adsorption stage 40. The adsorption stage 40 has a horizontal adsorption surface 41 which exhibits adsorption action through air adsorption or the like.

As illustrated in FIG. 6A, the frame substrate 31 is set on the adsorption stage 40 in a state where the frame substrate 31 is fixed by the agency of the adsorption action, with the upper surface 31a side thereof facing down at a predetermined position on the adsorption surface 41. The metal plate 5 is bonded and fixed to the frame substrate 31 on this adsorption surface 41 by using an adhesion such that the metal plate 5 stops up the frame opening 34 from the undersurface 31b side of the frame substrate 31.

Figure 6B:
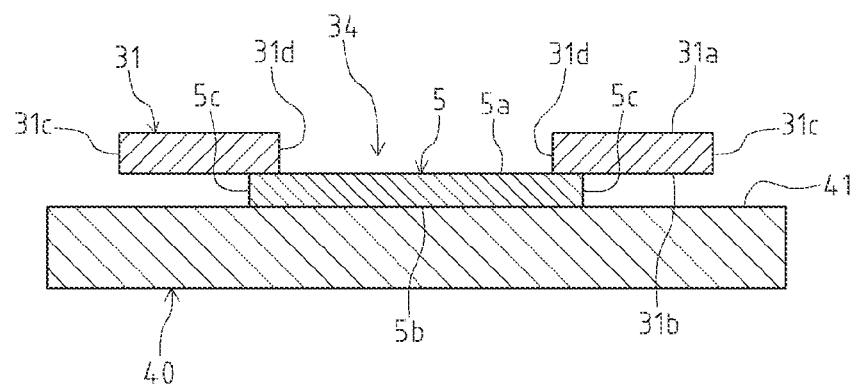

Next, a step of inverting the frame substrate 31 to which the metal plate 5 is fixed is performed as illustrated in FIG. 6B. In other words, the frame substrate 31 to which the metal plate 5 is fixed is turned upside down such that the metal plate 5 side is on the adsorption surface 41 side. This arrangement brings about a state where the metal plate 5 is adsorbed to the adsorption surface 41 from the undersurface 5b side, the frame substrate 31 is positioned on the upper side of the metal plate 5, and the upper surface 5a of the metal plate 5 is upwardly exposed via the frame opening 34.

Figure 6C:
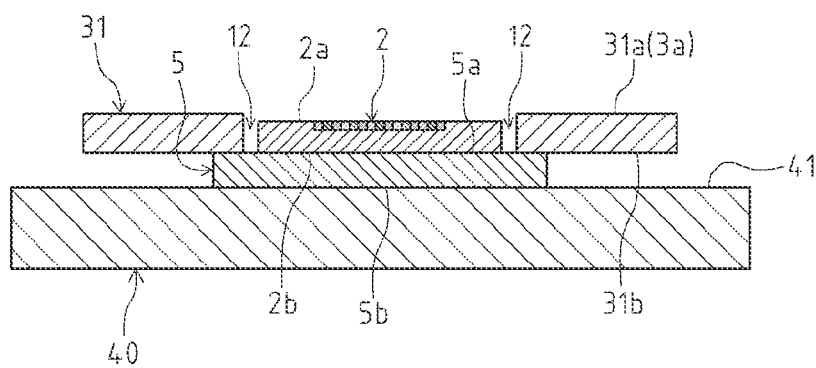

Next, a step is performed in which the image sensor 2 is fixed to the metal plate 5 on a plate surface side thereof that the frame opening 34 faces, that is, the upper surface 5a side, as illustrated in FIG. 6c. Specifically, the image sensor 2 is bonded and fixed to the upper surface 5a of the metal plate 5 facing the upper side from the frame opening 34 of the frame substrate 31, by being die-bonded with a die-bond material at a predetermined position with the back surface 2b side facing down. Thus, the image sensor 2 is supported and fixed with respect to the frame substrate 31 forming the substrate part 3 via the metal plate 5.

Regarding the die bonding of the image sensor 2 to the metal plate 5, the sensor front surface 2a, which has been fixed to the metal plate 5 through the step of fixing the image sensor 2 to the metal plate 5, is positioned below the substrate front surface 3a in the vertical direction. In other words, the image sensor 2 is provided so that the sensor front surface 2a is positioned below the upper surface 31a of the frame substrate 31, which becomes the substrate front surface 3a (see, FIG. 4). Here, the sensor front surface 2a may be positioned at the same position as the substrate front surface 3a in the vertical direction. In other words, the image sensor 2 may be provided such that the sensor front surface 2a is placed at the same height position as the upper surface 31a of the frame substrate 31 (see, FIG. 5).

An adjustment of a relationship in height position between the sensor front surface 2a and the substrate front surface 3a (upper surface 31a) is performed by, for example, an adjustment of the thickness of the frame substrate 31 of the substrate part 3, an adjustment of the thickness of the image sensor 2, and through the shape of the upper surface part of the metal plate 5 and the like. Regarding the shape of the upper surface part of the metal plate 5, the height position of the sensor front surface 2a can be adjusted by, for example, forming a concave fit part for fitting the image sensor 2 on the upper surface part of the metal plate 5, through an adjustment of the depth of the concave fit part.

Figure 6D:
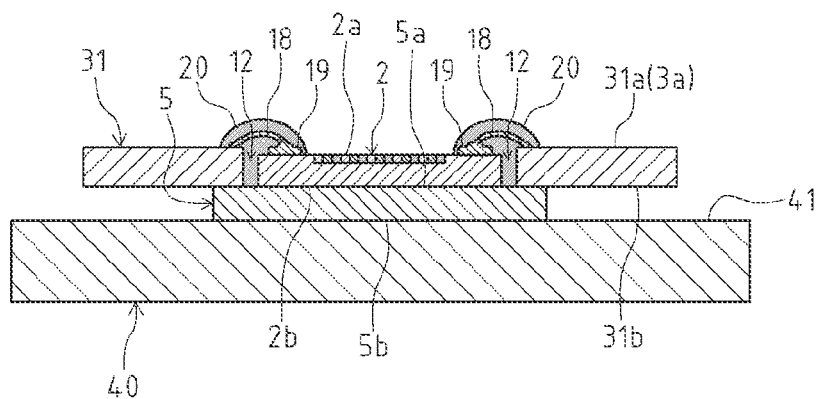

Next, after the step of fixing the image sensor 2 to the metal plate 5, a step of providing the bonding wires 18 between the sensor front surface 2a and the substrate front surface 3a is performed as illustrated in FIG. 6D. More specifically, the plurality of pad electrodes 19 formed on the sensor front surface 2a and the plurality of electrodes formed on the substrate front surface 3a are individually electrically connected by the respective bonding wires 18. Each bonding wire 18 is wired so that one end thereof is electrically connected to the respective pad electrodes 19 on the sensor front surface 2a, and the other end thereof is electrically connected to the respective electrodes on the substrate front surface 3a, and that each bonding wire 18 forms a predetermined convex shape, for example, an arch shape and the like, on the upper side.

Subsequently, a step is performed in which the resin protective parts 20 which coats the bonding wires 18 are provided between the image sensor 2 and the substrate part 3, as illustrated in FIG. 6D. In this step, the resin material that forms resin protective parts 20 (e.g., thermosetting resin) is applied by using a dispenser and the like to form the resin protective parts 20 including the coating part 21 and the buried part 22 (see, FIG. 4).

The resin material that forms resin protective parts 20 is applied between the image sensor 2 and the substrate part 3 while being discharged from a nozzle of the dispenser, so as to fill the gaps 12 and entirely coat the respective bonding wires 18. Thus, the resin protective parts 20 entirely coating the respective bonding wires 18 in correspondence with the convex shape of each bonding wire 18 are each formed in a humped shape.

Next, the cavity substrate 32 is bonded as illustrated in FIG. 7A. Specifically, the cavity substrate 32 is prepared, and a step is performed in which the cavity substrate 32 having the concavity 33 is attached on the undersurface 31b side, which is the back surface side of the frame substrate 31. The peripheral components 37, such as a capacitor, a resistance, and a connector, are mounted in advance on the undersurface 32b side, in the cavity substrate 32.

For the attachment of the cavity substrate 32 to the frame substrate 31, an adsorption stage 45 is used. The adsorption stage 45 has a horizontal adsorption surface 46 which exhibits adsorption action through air adsorption or the like. Recesses 47 for avoiding an interference with the peripheral components 37 are formed on the horizontal adsorption surface 46. Specifically, the recesses 47 are each a hollow portion which receives therein the peripheral components 37 provided to protrude from the undersurface 32b of the cavity substrate 32, and are each formed in correspondence with an arrangement area of each peripheral component 37. Thus, the undersurface 32b of the cavity substrate 32, which becomes the back surface 3b of the substrate part 3, is adsorbed on the adsorption surface 46 of the adsorption stage 45.

As illustrated in FIG. 7A, the cavity substrate 32 is set on the adsorption stage 45 with the undersurface 32b of the cavity substrate 32 facing down in a state where the peripheral components 37 are positioned inside the recesses 47 and the undersurface 32b is fixed to the adsorption surface 46 by the aid of adsorption action. The frame substrate 31, which supports the image sensor 2 via the metal plate 5, is fixed to this cavity substrate 32 on the adsorption surface 46 from the upper surface 32a side of the cavity substrate 32 so as to stop up the concavity 33.

The frame substrate 31 is fixed, with an adhesive and the like, to the cavity substrate 32 with the conductive sheet 35 between the undersurface 31b of the frame substrate 31 and the upper surface 32a of the cavity substrate 32. Note that the conductive sheet 35 itself may have the adhesion function. In this case, the conductive sheet 35 having the adhesion function fixes the frame substrate 31 to the cavity substrate 32. The conductive sheet 35 ensures an electric connection between the frame substrate 31 and the cavity substrate 32.

The frame substrate 31 is attached to the cavity substrate 32 such that the concavity 33 forms the recess 4 (see, FIG. 2) together with the frame opening 34 and that the lower gap 14 is formed between the metal plate 5 and the bottom surface 4d forming the recess 4 on at least the undersurface 5b side, which is the back surface side of the metal plate 5. In the present exemplary embodiment, the side gaps 13 each forming the hollow part 15 contiguously with the lower gap 14 is formed between the metal plate 5 and the substrate part 3 in addition to the lower gap 14. The substrate part 3 is formed by the frame substrate 31 being fixed to the cavity substrate 32 (see, FIG. 1).

Next, the frame 6 is bonded as illustrated in FIG. 7B. Specifically, a step is performed in which the base plate part 26 and the frame 6 having the support frame part 27 are attached on the substrate front surface 3a supported on the adsorption stage 45. The frame 6 is fixed, with a circumference edge part of the substrate front surface 3a serving as a support surface, by using a resin type adhesive or the like such that the opening 27c of the support frame part 27 is positioned above the image sensor 2.

The glass 7 is then bonded as illustrated in FIG. 7C. Specifically, the glass 7 is bonded and fixed to the support body part 27b of the frame 6 with an adhesion or the like so as to cover the entire opening 27c from above. Thus, the frame 6 and the glass 7 form the cavity 8, which is a sealed space, over the image sensor 2 and the substrate part 3.

Through the manufacturing steps as described above, the solid-state imaging device 1 according to the present exemplary embodiment can be obtained. More specifically, the solid-state imaging device 1 is provided with a package structure in a form where the metal plate 5 to which the image sensor 2 is die-bonded is imbedded within a package, and where a hollow is provided on the back surface side of the metal plate 5, as illustrated in FIG. 1. In this package structure, only the periphery portion of the upper surface 5a of the metal plate 5 is fixed to the overhangs 11 of the substrate part 3 with an adhesive, and the sensor front surface 2a is level with or lower than the substrate front surface 3a. Moreover, the substrate part 3 has a configuration including the frame substrate 31 which receives the fixation of the metal plate 5 and the cavity substrate 32 electrically connected to the frame substrate 31.

<3. Variation of Solid-State Imaging Device According to First Exemplary Embodiment>

Figure 8A:
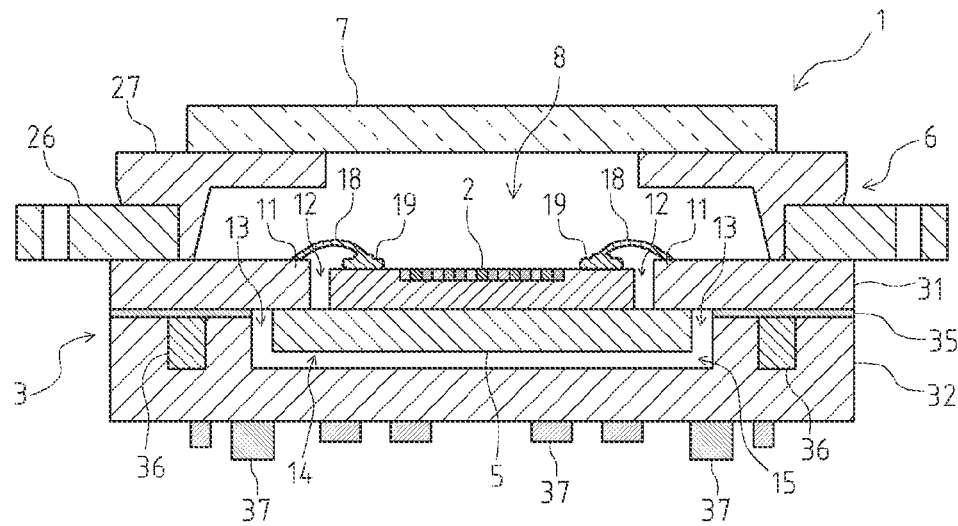
FIGS. 8A, 8B, and 8C are sectional side views illustrating a configuration of a variation of the solid-state imaging device according to the first exemplary embodiment of the present technology.
Figure 8B:
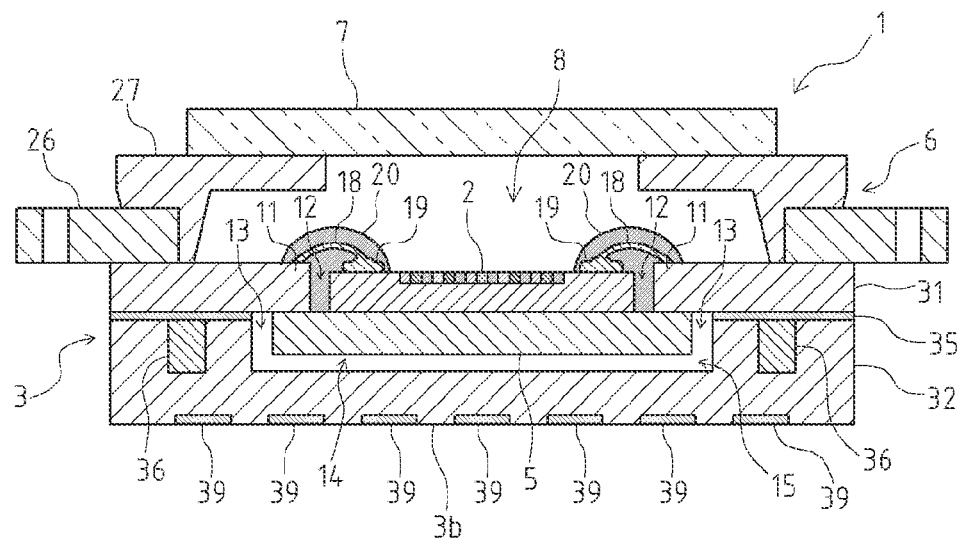
Figure 8C:
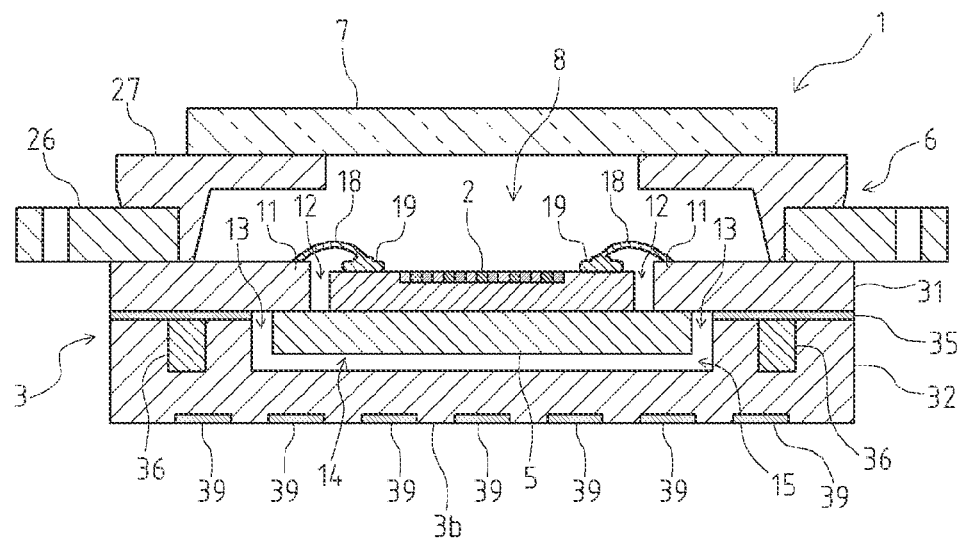

Variations of the solid-state imaging device 1 according to the first exemplary embodiment of the present technology are illustrated in FIGS. 8A, 8B, and 8C.

A first variation illustrated in FIG. 8A has a configuration in which the resin protective parts 20 are not provided in the solid-state imaging device 1. With such a configuration, the step of providing the resin protective parts 20 is omitted in the method for manufacturing the above-described solid-state imaging device 1.

A second variation illustrated in FIG. 8B has a configuration including a plurality of external terminals 39, in place of the peripheral components 37, such as a capacitor and a connector, in the solid-state imaging device 1. The external terminals 39 are formed inside a portion of the back surface 3b of the substrate part 3 so as to face the back surface 3b. In other words, the external terminals 39 are formed to be flush with the back surface 3b of the substrate part 3. The external terminals 39 are used for electrically connecting to a substrate, such as a flexible substrate, on which the solid-state imaging device 1 is mounted.

According to the second variation, an adsorption stage having a horizontal adsorption surface can be used in the step of fixing the frame substrate 31 to the cavity substrate 32 (see, FIG. 7A) and other steps, as with the adsorption stage 40 (see, FIG. 6A) which is used in the step of bonding the metal plate 5 and the other steps. In this case, for example, a series of steps in the method for manufacturing the above-described solid-state imaging device 1 can be performed using a common adsorption stage.

A third variation illustrated in FIG. 8C has a configuration in which no resin protective parts 20 is provided in the second variation illustrated in FIG. 8B.

The configurations of the variations as described above are appropriately employed in application of the solid-state imaging device 1, a device to which the solid-state imaging device 1 is installed, and the like.

According to the solid-state imaging device 1 according to the present exemplary embodiment and a manufacturing method thereof, the occurrence of warpage of a sensor chip serving as the image sensor 2 and a change in the warpage can be controlled. Moreover, it is possible to prevent an arrangement area for the external terminals 39 and the peripheral components 37 from being limited.

The solid-state imaging device 1 according to the present exemplary embodiment includes a configuration in which the image sensor 2 is indirectly supported with respect to the substrate part 3 via the metal plate 5 on which the substrate part 3 is fixed at the periphery portion of the upper surface 5a, and a hollow is provided on the back surface side of the metal plate 5 with the lower gap 14. According to such a configuration, the image sensor 2 can be supported without a direct contact with the substrate part 3 while a contact area of the metal plate 5 with the substrate part 3 can be reduced.

This arrangement can control a heat history during an assembly of the solid-state imaging device 1 or an electronic apparatus including the solid-state imaging device 1, and can also control warpage of the image sensor 2 and a change in the warpage due to a difference in coefficient of linear expansion between the image sensor 2 and the substrate part 3 and an increase in internal pressure of the cavity 8. The difference in coefficient of linear expansion arises from a change in surrounding environment during the use of assembled products.

Further, in a case where the back surface side of the metal plate 5 adheres to the substrate part 3, the metal plate 5 follows a change in warpage of the substrate part 3 due to a change in temperature or environment, and warpage of the image sensor 2 occurs along with this. In this regard, according to the solid-state imaging device 1 according to the present exemplary embodiment, the back surface side of the metal plate 5 is spaced from the substrate part 3, so that the metal plate 5 is not susceptible to a deformation of the substrate part 3, thus controlling warpage of the image sensor 2 and the change in the warpage. As a result, reduction in image quality caused by the solid-state imaging device 1, resulting from the warpage of the image sensor 2 and the change in the warpage, can be controlled.

In particular, in a case where the substrate part 3 is an organic substrate formed by an organic material, such as plastic, the substrate part 3 has relatively low rigidity, so that expansion and contraction due to moisture absorption and/or moisture desorption relatively increases, and that the difference in coefficient of linear expansion between the image sensor 2 and the substrate part 3 relatively increases. In view of these, in a case where the substrate part 3 is an organic substrate, employment of the configuration of the solid-state imaging device 1 can efficiently control warpage of the image sensor 2 and a change in the warpage.

Moreover, in a configuration including a plurality of the external terminals 39 on the back surface 3b side of the substrate part 3 as in the configurations of the second variation illustrated in FIG. 8B and the third variation illustrated in FIG. 8C, for example, the solid-state imaging device 1 is subjected to a reflow process of melting solder for junction when being mounted on a substrate or the like, so that the solid-state imaging device 1 has relatively abundant opportunity to be heated. Thus, in a case where the external terminals 39 are included, a reduction action of warpage of the image sensor 2 occurring under the influence of heat and a change in the warpage can be efficiently obtained through the agency of the configuration of the solid-state imaging device 1.

Furthermore, according to the solid-state imaging device 1 according to the present exemplary embodiment, the metal plate 5 for indirectly supporting the image sensor 2 with respect to the substrate part 3 is provided in a state where the metal plate 5 floats in the recess 4 formed on the substrate part 3 to be upwardly open. According to such a configuration, a bottom surface part and a side surface part of the substrate part 3 form an outer surface part of the solid-state imaging device 1, without being influenced by the metal plate 5. With this arrangement, arrangement areas of the peripheral components 37, such as a capacitor, and the external terminals 39 on the substrate part 3 are not limited, and a high degree of flexibility can be obtained for the arrangement areas of the peripheral components 37 and the external terminals 39. The mounting of the peripheral components 37 and the arrangement of the external terminals 39 can be performed in a free layout on the back surface 3b of the substrate part 3, in particular.

Moreover, the solid-state imaging device 1 according to the present exemplary embodiment has a configuration in which the substrate part 3 has the frame substrate 31 and the cavity substrate 32 forming the recess 4 together with the frame substrate 31, and these are electrically connected. According to such a configuration, it is possible to easily make the recess 4 including the overhangs 11 for supporting the metal plate 5 with the metal plate 5 floating above the substrate part 3. Further, the frame substrate 31 and the cavity substrate 32 can be manufactured as different parts, which facilitate the manufacturing of the wiring structure on the substrate part 3. Thus, a more complex circuit structure can be easily faced.

Furthermore, in the solid-state imaging device 1 according to the present exemplary embodiment, regarding a height relationship between the sensor front surface 2a and the substrate front surface 3a between which the bonding wires 18 are disposed, the sensor front surface 2a is level with or lower than the substrate front surface 3a. According to such a configuration, the occurrence of a flare can be controlled and the resin protective parts 20 can be easily formed. A description will be provided of attainment of such actions and effects by using a configuration of a comparative example.

Figure 9:
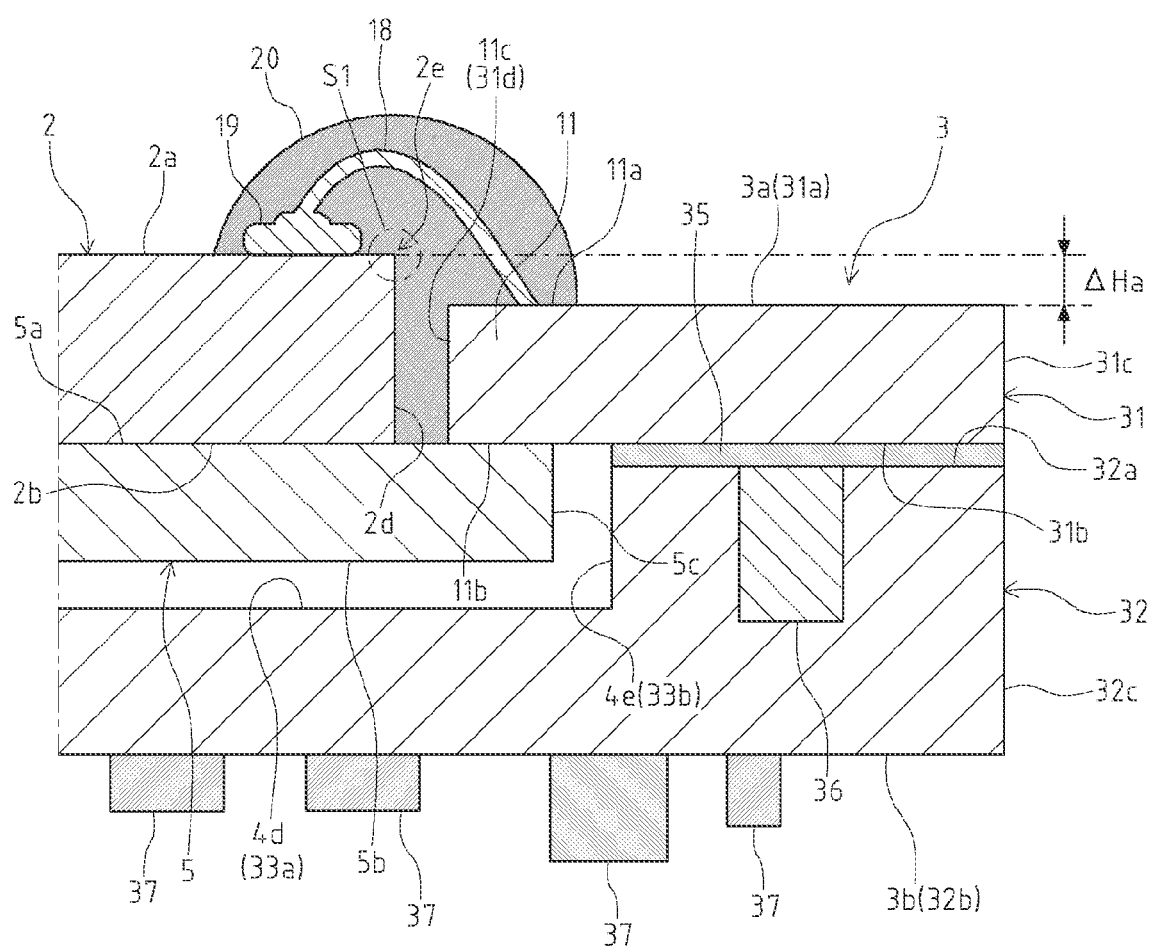
FIG. 9 is a partially enlarged sectional side view illustrating a configuration of supporting an image sensor in a comparative example in contrast to the present technology.

FIG. 9 illustrates a configuration in which a height position of the sensor front surface 2a is higher than a height position of the substrate front surface 3a, as a comparative example. Specifically, the height position of the sensor front surface 2a is positioned ΔHa higher than the height position of the substrate front surface 3a in the configuration of this comparative example. Thus, the height of the respective side surfaces 2d of the image sensor 2 is ΔHa higher than the height of the respective inner side surfaces 11c of the overhangs 11, with reference to the upper surface 5a of the metal plate 5.

According to the configuration of the comparative example, the bonding wires 18 are downwardly struck from the image sensor 2 side to the substrate part 3 side. Accordingly, there arises the need to form the bonding wires 18 having a high-loop wire bond in shape from the viewpoint of avoiding a short due to contact of the bonding wires 18 to an edge part 2e (portion indicated by a circle Si) on the upper side of the image sensor 2. In other words, there arises the need to raise the top height of the respective wiring shape of the bonding wires 18 forming a convexly curved shape or a bending shape on its upper side.

With the bonding wires 18 having a high-loop shape, the bonding wires 18 become prone to receive light transmitted through the glass 7, which increases the risk of the occurrence of a flare. In addition, with the bonding wires 18 having a high-loop shape, there arises the need to heap up a resin material for forming the resin protective parts 20 in correspondence with the high-loop shape of the bonding wires 18 in forming the resin protective parts 20, and thus, there is an issue that the forming of the resin protective parts 20 becomes difficult.

In contrast to such a configuration of the comparative example, according to the configuration in which the sensor front surface 2a is made level with or lower than the substrate front surface 3a as illustrated in FIG. 5 and FIG. 4, the bonding wires 18 are each parallelly ejected or stuck downward from the image sensor 2 side to the substrate part 3 side. This makes the bonding wires 18 harder to come into contact with the edge part 2e (portion indicated by the circle Sl) on the upper side of the image sensor 2, and thus, it is possible to form the bonding wires 18 in a low-loop wire bond shape. In other words, the top height of the wiring shape of the respective bonding wires 18 forming a convexly curved shape or a bending shape on its upper side can be lowered.

With the bonding wires 18 having a low-loop shape, the bonding wires 18 become less prone to receive light transmitted through the glass 7, which decreases the risk of the occurrence of a flare. Moreover, the bonding wires 18 having a low-loop shape excludes the need to heap up the resin material in forming the resin protective parts 20, thus facilitating the forming of the resin protective parts 20.

Further, regarding the forming of resin protective parts 20, making the bonding wire 18 in a low-loop shape leads to obtaining actions and effects as described below. Specifically, an amount of the resin material of the resin protective parts 20 can be reduced, thus cutting down on costs. Moreover, it is possible to prevent the resin material of the resin protective parts 20 from flowing out of a connection portion of the bonding wire 18 and adhering to an area undesired for the adhesion, on the sensor front surface 2a and the substrate front surface 3a. Furthermore, it is possible to facilitate the flowing of the resin material of resin protective parts 20 into the gaps 12 which are positioned below the bonding wire 18 and between the image sensor 2 and the substrate part 3.

Further, the solid-state imaging device 1 according to the present exemplary embodiment includes the resin protective parts 20 which each coat the respective bonding wires 18. With such a configuration, the bonding wires 18 can be protected, and flare control measures can be easily taken.

Furthermore, according to the method for manufacturing the solid-state imaging device 1 according to the present exemplary embodiment, the solid-state imaging device 1 with which the above-described actions and effects can be obtained can be easily manufactured through efficient steps.

<4. Configuration Example of Solid-State Imaging Device According to Second Exemplary Embodiment>

Figure 10:
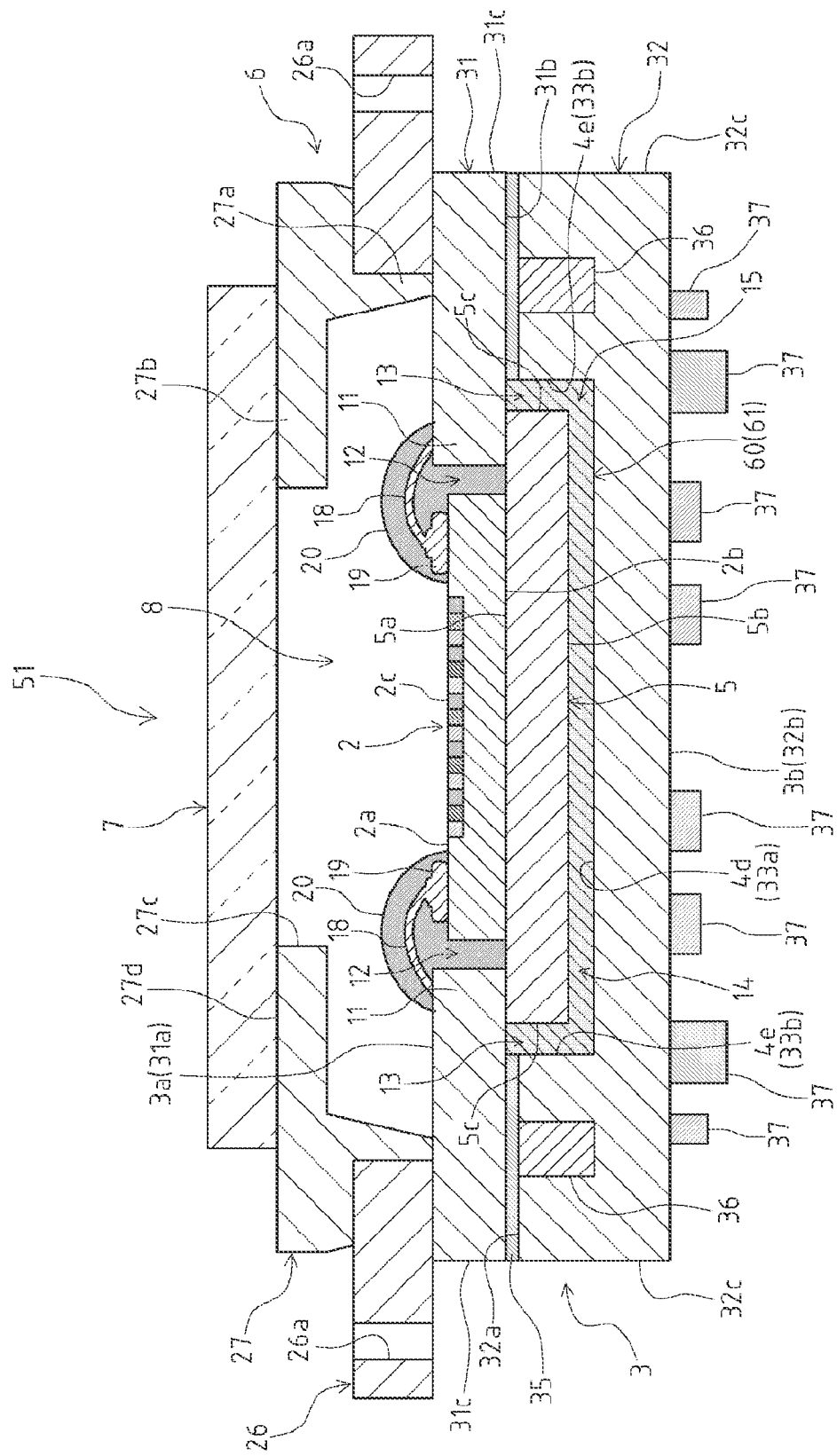
FIG. 10 is a sectional side view illustrating a configuration of a solid-state imaging device according to a second exemplary embodiment of the present technology.

A description will be provided of a configuration example of the solid-state imaging device 1 according to a second exemplary embodiment of the present technology with reference to FIG. 10. Note that configurations in common with those of the first exemplary embodiment are assigned the same reference symbols, and descriptions thereof are omitted.

As illustrated in FIG. 10, a solid-state imaging device 51 according to the present exemplary embodiment is different from the solid-state imaging device 1 of the first exemplary embodiment in that the solid-state imaging device 51 includes a thermal conduction part 60 which is provided in a state of being in contact with both the metal plate 5 and the substrate part 3 and transfers heat of the metal plate 5 to the substrate part 3. It is desirable that the thermal conduction part 60 be provided to occupy at least the entirety of the lower gap 14 between the undersurface 5b of the metal plate 5 and the bottom surface 4d of the substrate part 3.

In the present configuration example, the solid-state imaging device 51 includes, as the thermal conduction part 60, a filling resin part 61 which is formed by a resin so as to fill the space part between the metal plate 5 and the substrate part 3. The filling resin part 61 is formed by a resin entirely filling the hollow part 15 in contiguous with the side gaps 13 and the lower gap 14.

Accordingly, the filling resin part 61 has an outer form coinciding with the surface shape forming the hollow part 15, that is, a flat box shaped form. More specifically, the filling resin part 61 is in contact with the entire respective surfaces of the undersurface 5b and the side surfaces 5c with respect to the metal plate 5, and in contact with the entire respective surfaces of the bottom surface 4d and the lower inner side surfaces 4e with respect to the substrate part 3. Thus, the outer form of the filling resin part 61 is defined by the surfaces in contact with these surfaces.

The filling resin part 61 is formed by a high thermoconductive resin material having a relatively high thermal conductivity. The filling resin part 61 is, for example, thermoplastic, and has such characteristics that the filling resin part 61 exhibits low elasticity at a high temperature in a reflow process or the like and does not inhibit the deformation of the substrate part 3 and the like. For the filling resin part 61, a material with which a buffer action between the metal plate 5 and the substrate part 3 can be obtained is desirable.

More specifically, examples of a material of the filling resin part 61 include a composite having one of a polyether-imide resin, a polyether-amide resin, and a polyether-amide-imide resin as the main ingredient. Additionally, the examples include a composite obtained by a plastic segment being modified into any one of a polyimide resin, a polyamide resin, and a polyamide-imide resin. In this case, for example, a material obtained by adding siloxane imide serving as a soft segment to an imide resin (an aromatic polyimide) serving as a hard segment is used. The examples further include a composite which has one of a polyimide resin, a polyamide resin, and a polyamide-imide resin as the main ingredient and contains thermoplastic resin particles. Moreover, a material obtained by modifying a thermoplastic material, such as a polyamide silicone copolymer and a polyimide-amide silicone copolymer, and a composite of this material and those materials may be used.

<5. Method for Manufacturing Solid-State Imaging Device According to Second Exemplary Embodiment>

Method for manufacturing the solid-state imaging device 51 according to the second exemplary embodiment of the present technology is used, for example, the flowing method.

In the method for manufacturing the solid-state imaging device 1 according to the first exemplary embodiment described above, a resin material to become the filling resin part 61 is put into the concavity 33 in a state where the cavity substrate 32 is set on the adsorption stage 45 (see, FIG. 7A). Subsequently, the frame substrate 31 that supports the image sensor 2 via the metal plate 5 with respect to the cavity substrate 32 is mounted on the cavity substrate 32.

Subsequently, in order to solidify the resin inside the hollow part 15, baking is performed at a predetermined temperature. The baking temperature is appropriately set depending on the resin material, solvent contained therein, and the like. The resin inside the hollow part 15 is solidified through the baking, and thus forming the filling resin part 61.

Alternatively, a method may be employed as the method for forming the filling resin part 61, in which, for example, the cavity substrate 32 is attached to the frame substrate 31 as illustrated in FIG. 7A, and then the resin material which becomes the filling resin part 61 is injected into the hollow part 15. In this case, an inlet for injection of the resin material which becomes the filling resin part 61 is provided on either or both of the frame substrate 31 side and the cavity substrate 32 side. After the hollow part 15 is filled with the resin material, the baking is performed as described above to solidify the resin inside the hollow part 15, and thus, the filling resin part 61 is formed.

After the filling resin part 61 is formed, the frame 6 is bonded (see, FIG. 7B), and then, the glass 7 is bonded (see, FIG. 7C). Thus, the solid-state imaging device 51 of the present exemplary embodiment as illustrated in FIG. 10 can be obtained.

According to the solid-state imaging device 51 according to the present exemplary embodiment, the following actions and effects can be obtained in addition to the actions and effects that can be obtained with the solid-state imaging device 1 according to the first exemplary embodiment.

Specifically, according to the solid-state imaging device 51 according to the present exemplary embodiment, the hollow part 15 includes therein the filling resin part 61 as a thermal conduction part 60, so that the heat of the metal plate 5, which is heated by heat liberated by the image sensor 2, is transferred to the substrate part 3 via the filling resin part 61. This can improve heat dissipation properties of the solid-state imaging device 51.

<6. Variation of Solid-State Imaging Device According to Second Exemplary Embodiment>

Figure 11A:
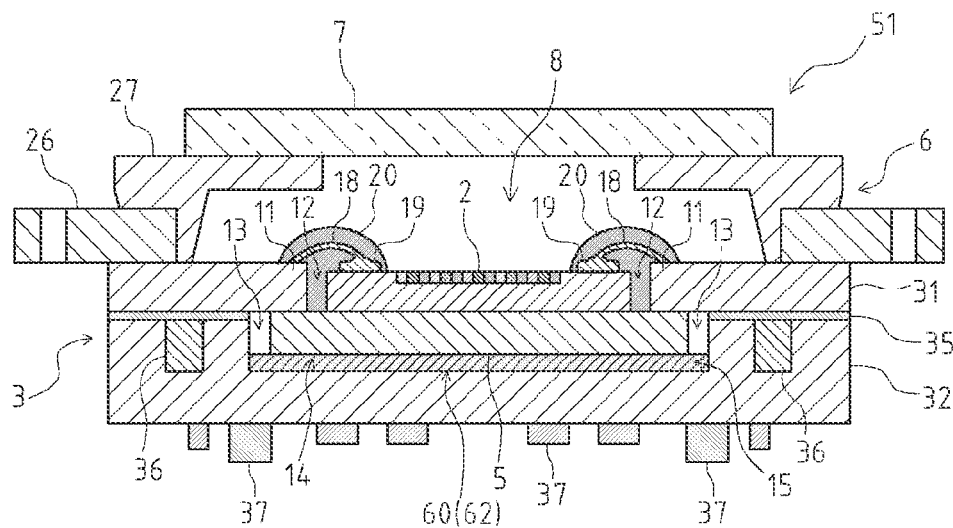
Figure 11B:
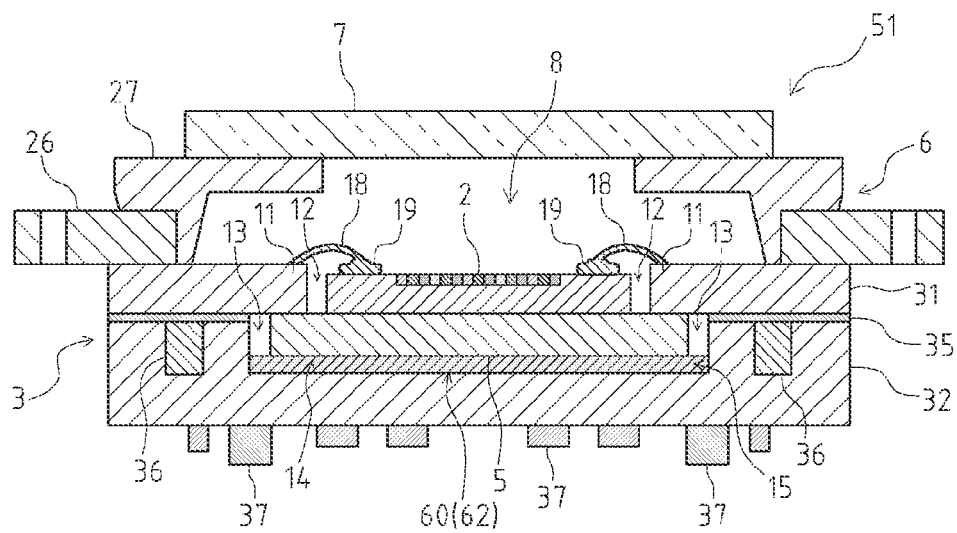
Figure 11C:
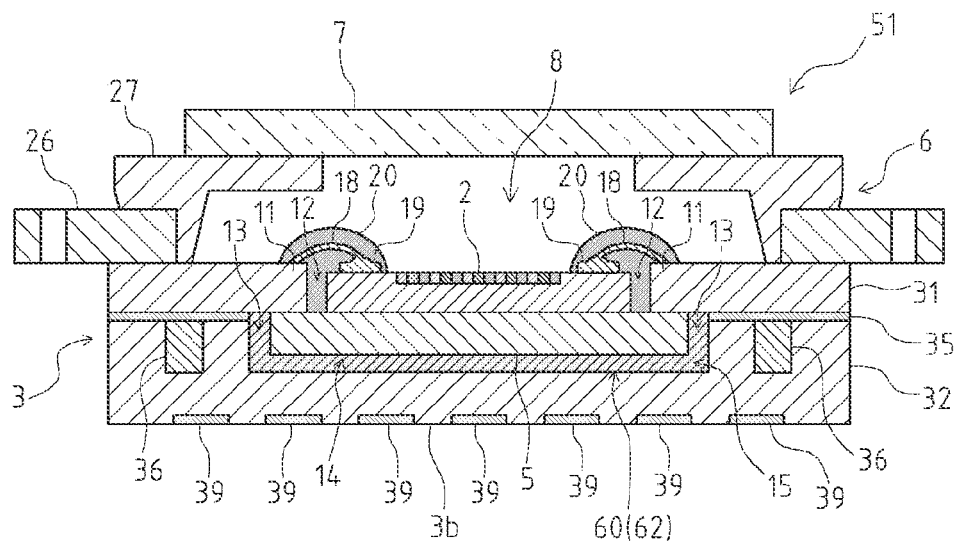

Variations of the solid-state imaging device 51 according to the second exemplary embodiment of the present technology are illustrated in FIGS. 11A, 11B, and 11C.

In a first variation illustrated in FIG. 11A, a resin part 62 provided only in a space part below the metal plate 5 is included as the thermal conduction part 60 in the solid-state imaging device 51. Specifically, the resin part 62 is provided so as to entirely occupy the lower gap 14 between the undersurface 5b of the metal plate 5 and the bottom surface 4d of the substrate part 3. A material similar to the above-described resin material of the filling resin part 61 is used for a material of the resin part 62.

The heat of the metal plate 5 can be transferred to the substrate part 3 through the resin part 62 also with such a configuration, and the heat dissipation properties of the solid-state imaging device 51 can be improved.

In this manner, the thermal conduction part 60 is provided so as to occupy at least a part of the space part between the metal plate 5 and the substrate part 3. Accordingly, the thermal conduction part 60 may be provided in, for example, only the side gaps 13, or may be partially provided in the respective space parts of the side gaps 13 and the lower gap 14. Further, the material of the thermal conduction part 60 is not limited to a resin material, and ceramics, a metal material, a semiconductor, such as silicon, and the like may be used.

Further, variations of the solid-state imaging device 51 include a configuration in which the resin protective parts 20 are not provided as illustrated in FIG. 11B and a configuration provided with the plurality of external terminals 39 on the back surface 3b of the substrate part 3 as illustrated in FIG. 11c, as in the variations of the first exemplary embodiment.

<7. Configuration Example of Electronic Apparatus>

An application in which a solid-state imaging device according to an exemplary embodiment described above is applied to an electronic apparatus will be described with reference to FIG. 12. Note that, here, an application of the solid-state imaging device 1 according to the first exemplary embodiment will be described.

The solid-state imaging device 1 is applicable to general electronic apparatuses that use a solid-state imaging element for an image capturing unit (photoelectric conversion unit), such as an image capturing device, such as a digital still camera and a digital video camera, a mobile terminal device having an image capturing function, and a copying machine using a solid-state imaging element for an image reading unit. The solid-state imaging element may have a configuration formed as one chip, or a configuration of a module which has an image capturing function and in which an image capturing unit and signal processing unit or an optical system are collectively packaged.

Figure 12:
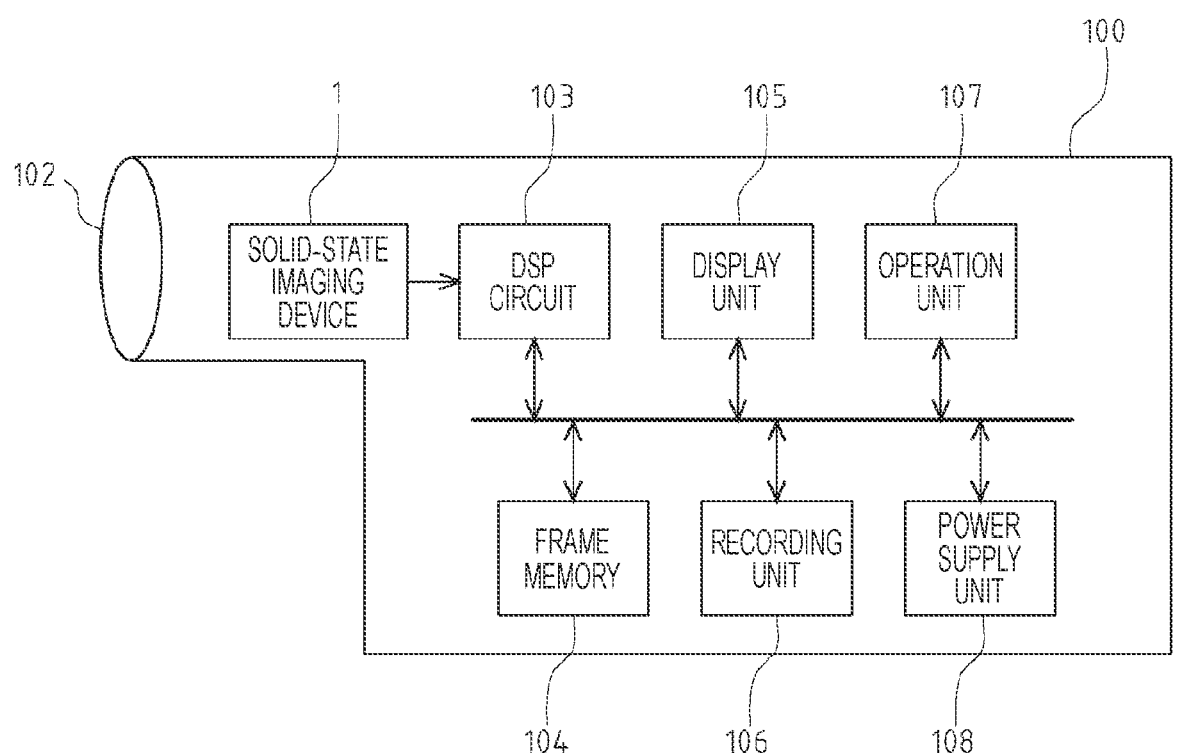
FIG. 12 is a block diagram illustrating a configuration example of an electronic apparatus provided with a solid-state imaging device according to an exemplary embodiment of the present technology.

As illustrated in FIG. 12, an image capturing device 100 serving as an electronic apparatus includes an optical unit 102, a solid-state imaging device 1, a digital signal processor (DSP) circuit 103 serving as a camera signal processing circuit, a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are mutually connected via a bus line 109.

The optical unit 102 includes a plurality of lens, and captures incident light (image light) from an object to form an image on an image capturing surface of the solid-state imaging device 1. The solid-state imaging device 1 converts an amount of the incident light formed as the image on the image capturing surface by the optical unit 102 into an electric signal in a pixel unit, and outputs the electric signal as a pixel signal.

The display unit 105 includes, for example, a panel display device, such as a liquid crystal panel and an organic electro luminescence (EL) panel, and displays a moving image or a still image captured by the solid-state imaging device 1. The recording unit 106 records the moving image or the still image captured by the solid-state imaging device 1 in a recording medium, such as a hard disk and a semiconductor memory.

The operation unit 107 issues an operation command for various functions of image capturing device 100 under user operation. The power supply unit 108 supplies a variety of power to be used as operation power for the DSP circuit 103, the frame memory 104, the display unit 105, the recording unit 106, and the operation unit 107, to these power-supply targets as appropriate.

According to the image capturing device 100 as described above, the occurrence of warpage of a sensor chip serving as the image sensor 2 and a change in the warpage can be controlled in the solid-state imaging device 1, so that a high-quality captured image can be obtained. Further, it is possible to prevent arrangement areas of the external terminals 39 and the peripheral components 37 from being limited in the solid-state imaging device 1. Furthermore, in place of the solid-state imaging device 1, application of the solid-state imaging device 51 of the second exemplary embodiment in which the thermal conduction part 60 is included can improve heat dissipation properties in the solid-state imaging device 51 and the image capturing device 100.

The illustrations of the exemplary embodiments are each merely an example of the present technology, and the present technology is not limited to the above described exemplary embodiments. For this reason, it is a matter of course that various modifications can be made in accordance with the design and the like as long as they do not depart from the technical idea according to the present disclosure, other than the embodiments described above. Further, the effects described in the present disclosure are merely examples and are not limited, and other effects may be obtained. Moreover, the variations described in each exemplary embodiment can be appropriately combined in other exemplary embodiments.

While a CMOS solid-state imaging device has been described as an example of a semiconductor device according to the present technology in the above-described exemplary embodiments, the present technology is also applicable to other solid-state imaging devices, for example, a CCD solid-state imaging device. Moreover, the present technology is applicable not limited to a solid-state imaging device, but is also applicable to a semiconductor device including a semiconductor element.

According to the above-described exemplary embodiments, while the solid-state imaging device includes the metal plate 5 formed by stainless steel (SUS) and the like, which is an example of a plate shaped member according to the present technology, the material of the plate shaped member according to the present technology is not limited to a metal material. For example, ceramics, a resin material, a semiconductor, such as silicon, and the like may be used. However, it is desirable that the material of the plate shaped member be a material having a coefficient of linear expansion similar to that of a semiconductor material (silicon and the like) forming the image sensor 2 serving as a semiconductor element according to the present technology, from the viewpoint of controlling the warpage of the image sensor 2. For the material of the plate shaped member, SUS430, which is a type of stainless steel (SUS), is preferably used because SUS430 has a coefficient of linear expansion relatively close to that of silicon and is relatively inexpensive.

Note that the present technology may be configured as below.

(1)

A semiconductor device, including:

a semiconductor element in which one plate surface side of a semiconductor substrate is set as a light-receiving side;

a substrate part having a recess, the recess being open to face a front surface side that is the light-receiving side and positioning the semiconductor element on the front surface side; and a plate shaped member positioned in the recess in a state where the plate shaped member is fixed to the substrate part, the plate shaped member fixing the semiconductor element to one plate surface side and being provided via a gap on at least another plate surface side with respect to a surface forming the recess.

(2)

The semiconductor device according to (1), in which the substrate part includes:

a first substrate having a frame shape forming a through opening; and a second substrate having a concavity in which a front surface side of the substrate part is set as an opening side, the second substrate being provided on a back surface side of the substrate part with respect to the first substrate and forming, with the concavity, the recess together with the through opening.

(3)

The semiconductor device according to (1) or (2), further including a thermal conduction part provided in a state of being in contact with both the plate shaped member and the substrate part, the thermal conduction part transferring heat of the plate shaped member to the substrate part.

(4)

The semiconductor device according to (3), in which the thermal conduction part is a filling resin part formed by a resin so as to fill a space part between the plate shaped member and the substrate part.

(5)

The semiconductor device according to any one of (1) to (4), further including a connection member provided between a front surface of the semiconductor element and a front surface of the substrate part, the connection member electrically connecting the semiconductor element and the substrate part, in which, in a plate thickness direction of the semiconductor element, the front surface of the semiconductor element is positioned at a same position as a position of the front surface of the substrate part or at a position on a bottom side of the recess with reference to the front surface of the substrate part.

(6)

The semiconductor device according to (5), further including a resin part provided between the semiconductor element and the substrate part, the resin part coating the connection member.

(7)

An electronic apparatus, including a semiconductor device including:

a semiconductor element in which one plate surface side of a semiconductor substrate is set as a light-receiving side;

a substrate part having a recess, the recess being open to face a front surface side that is the light-receiving side and positioning the semiconductor element on the front surface side; and a plate shaped member positioned in the recess in a state where the plate shaped member is fixed to the substrate part, the plate shaped member fixing the semiconductor element to one plate surface side and being provided via a gap on at least another plate surface side with respect to a surface forming the recess.

(8)

A method for manufacturing a semiconductor device, the method including:
 a step of attaching a plate shaped member to a back surface side of a first substrate having a frame shape forming a through opening, so as to cover the through opening;
 a step of fixing, onto a plate surface side of the plate shaped member, a semiconductor element in which one plate surface side of a semiconductor substrate is set as a light-receiving side, the plate surface side being a side that the through opening faces; and
 a step of attaching, to the back surface side of the first substrate, a second substrate having a concavity in which a front surface side is set as an opening side, such that the concavity forms a recess together with the through opening, and that a gap is formed between the plate shaped member and a surface forming the recess on at least a back surface side of the plate shaped member, the recess being open to face a front surface side that is the light-receiving side and positioning the semiconductor element on the front surface side.

(9)

The method for manufacturing the semiconductor device according to (8), further including:
 after the step of fixing the semiconductor element to the plate shaped member,
 a step of providing a connection member between a front surface of the semiconductor element and a front surface of the substrate part, the connection member electrically connecting the semiconductor element and the substrate part; and
 a step of providing a resin part between the semiconductor element and the substrate part, the resin part coating the connection member,
 in which, in a plate thickness direction of the semiconductor element, the front surface of the semiconductor element fixed to the plate shaped member through the step of fixing the semiconductor element to the plate shaped member is positioned at a same position as a position of the front surface of the substrate part or at a position on a bottom side of the recess with reference to the front surface of the substrate part.

REFERENCE SIGNS LIST

1 Solid-state imaging device (semiconductor device)
2 Image sensor (semiconductor element)
2a Front surface
2b Back surface
3 Substrate part
3a Front surface
3b Back surface
4 Recess
4d Bottom surface
5 Metal plate (plate shaped member)
5a Upper surface
5b Undersurface
14 Lower gap
18 Bonding wire (connection member)
20 Resin protective part (resin part)
31 Frame substrate (first substrate)
32 Cavity substrate (second substrate)
33 Concavity
34 Frame opening
51 Solid-state imaging device (semiconductor device)
60 Thermal conduction part
61 Filling resin part
62 Resin part
100 Image capturing device (electronic apparatus)

The invention claimed is:

1. A semiconductor device, comprising:
 a semiconductor element;
 a substrate part having a recess, wherein
  the recess is open to face a front surface side that is a light-receiving side, and
  the substrate part positions the semiconductor element on the front surface side; and
 a plate shaped member in the recess in a state where the plate shaped member is fixed to the substrate part, wherein
  the semiconductor element is fixed to a first plate surface side of the plate shaped member, and
  the plate shaped member is provided via a gap on at least a second plate surface side, opposite to the first plate surface side, of the plate shaped member with respect to a surface of the substrate part that provides the recess.

2. The semiconductor device according to claim 1, wherein
 the substrate part includes:
  a first substrate having a frame shape that provides a through opening; and
  a second substrate having a concavity in which the front surface side of the substrate part is set as an opening side, wherein
   the second substrate is on a back surface side of the substrate part with respect to the first substrate, and
   the second substrate provides, with the concavity, the recess together with the through opening.

3. The semiconductor device according to claim 1, further comprising
 a thermal conduction part in contact with both the plate shaped member and the substrate part, wherein the thermal conduction part is configured to transfer heat of the plate shaped member to the substrate part.

4. The semiconductor device according to claim 3, wherein
 the thermal conduction part is a filling resin part comprising a resin to fill a space part between the plate shaped member and the substrate part.

5. The semiconductor device according to claim 1, further comprising
 a connection member between a front surface of the semiconductor element and a front surface of the substrate part, wherein the connection member electrically connects the semiconductor element and the substrate part,
  wherein, in a plate thickness direction of the semiconductor element, the front surface of the semiconductor element is positioned at one of a same position as a position of the front surface of the substrate part or a position on a bottom side of the recess with reference to the front surface of the substrate part.

6. The semiconductor device according to claim 5, further comprising
 a resin part between the semiconductor element and the substrate part, wherein the resin part coats the connection member.

7. An electronic apparatus, comprising
a semiconductor device including:
   a semiconductor element;
   a substrate part having a recess, wherein
      the recess is open to face a front surface side that is a light-receiving side, and
      the substrate part positions the semiconductor element on the front surface side; and
   a plate shaped member in the recess in a state where the plate shaped member is fixed to the substrate part, wherein
      the semiconductor element is fixed to a first plate surface side of the plate shaped member, and
      the plate shaped member is provided via a gap on at least a second plate surface side, opposite to the first plate surface side, of the plate shaped member with respect to a surface of the substrate part that provides the recess.

8. A method for manufacturing a semiconductor device, the method comprising:
   attaching a plate shaped member to a back surface side of a first substrate, wherein
      the first substrate has a frame shape that provides a through opening, and
      the plate shaped member covers the through opening;
   fixing, onto a plate surface side of the plate shaped member, a semiconductor element, wherein the plate surface side is a side that the through opening faces; and
   attaching, to the back surface side of the first substrate, a second substrate having a concavity, wherein
      a front surface side of the second substrate is an opening side of the concavity,
      the concavity provides a recess together with the through opening, and
      a gap is provided between the plate shaped member and a surface that provides the recess on at least a back surface side of the plate shaped member,
      the recess is open to face the front surface side that is a light-receiving side, and
      the second substrate positions the semiconductor element on the front surface side.

9. The method for manufacturing the semiconductor device according to claim 8, further comprising:
   providing a connection member between a front surface of the semiconductor element and a front surface of the first substrate, the connection member electrically connecting the semiconductor element and the first substrate; and
   providing a resin part between the semiconductor element and the first substrate, the resin part coating the connection member,
      wherein, in a plate thickness direction of the semiconductor element, the front surface of the semiconductor element fixed to the plate shaped member through the fixing of the semiconductor element to the plate shaped member is positioned at one of a same position as a position of the front surface of the second substrate or a position on a bottom side of the recess with reference to the front surface of the second substrate.

* * * * *